(12) United States Patent
Ching et al.

(10) Patent No.: US 9,559,184 B2
(45) Date of Patent: Jan. 31, 2017

(54) DEVICES INCLUDING GATE SPACER WITH GAP OR VOID AND METHODS OF FORMING THE SAME

(71) Applicant: Taiwan Semiconductor Manufacturing Company, Ltd., Hsin-Chu (TW)

(72) Inventors: Kuo-Cheng Ching, Zhubei (TW); Ching-Wei Tsai, Hsin-Chu (TW); Chi-Wen Liu, Hsin-Chu (TW); Ying-Keung Leung, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/739,977

(22) Filed: Jun. 15, 2015

(65) Prior Publication Data

US 2016/0365426 A1   Dec. 15, 2016

(51) Int. Cl.
*H01L 29/76* (2006.01)
*H01L 29/66* (2006.01)
*H01L 29/78* (2006.01)

(52) U.S. Cl.
CPC ....... *H01L 29/6656* (2013.01); *H01L 29/6653* (2013.01); *H01L 29/66545* (2013.01); *H01L 29/66795* (2013.01); *H01L 29/7851* (2013.01)

(58) Field of Classification Search
CPC ............. H01L 29/6656; H01L 29/6653; H01L 29/66545; H01L 29/7851
USPC .......................................................... 257/288
See application file for complete search history.

(56) References Cited

U.S. PATENT DOCUMENTS

| 6,107,667 | A | 8/2000 | An et al. |
| 7,585,716 | B2* | 9/2009 | Cheng ............... H01L 29/42368 257/E21.453 |
| 7,629,213 | B2 | 12/2009 | Cho et al. |
| 7,838,373 | B2 | 11/2010 | Giles et al. |
| 9,190,486 | B2* | 11/2015 | Xie .................... H01L 29/66545 |
| 2002/0163036 | A1* | 11/2002 | Miura ............... H01L 21/28114 257/336 |

* cited by examiner

*Primary Examiner* — Anthony Ho
(74) *Attorney, Agent, or Firm* — Slater Matsil, LLP

(57) ABSTRACT

Devices and structures that include a gate spacer having a gap or void are described along with methods of forming such devices and structures. In accordance with some embodiments, a structure includes a substrate, a gate stack over the substrate, a contact over the substrate, and a spacer disposed laterally between the gate stack and the contact. The spacer includes a first dielectric sidewall portion and a second dielectric sidewall portion. A void is disposed between the first dielectric sidewall portion and the second dielectric sidewall portion.

20 Claims, 21 Drawing Sheets

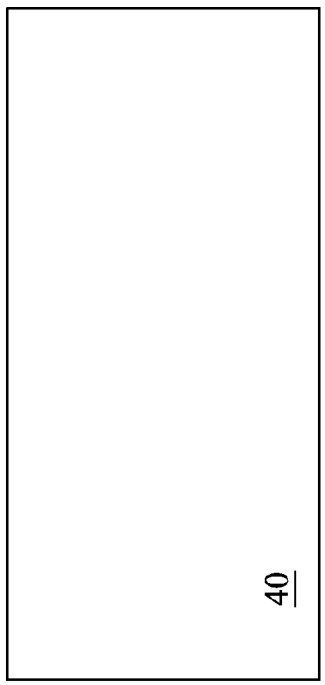
Fig. 2A
Fig. 2B
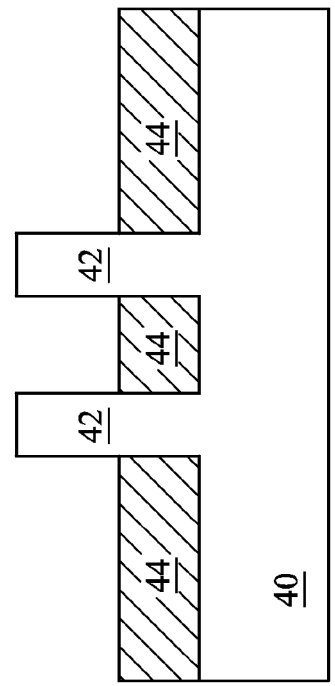
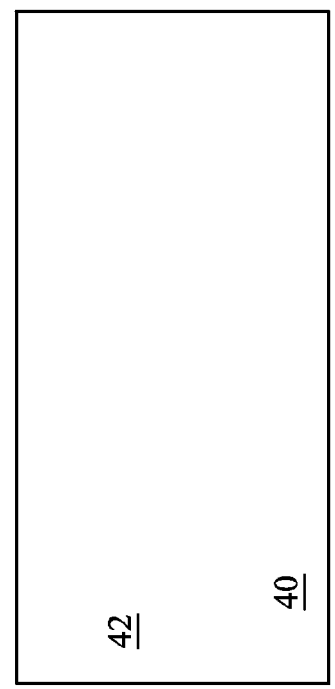
Fig. 3A
Fig. 3B

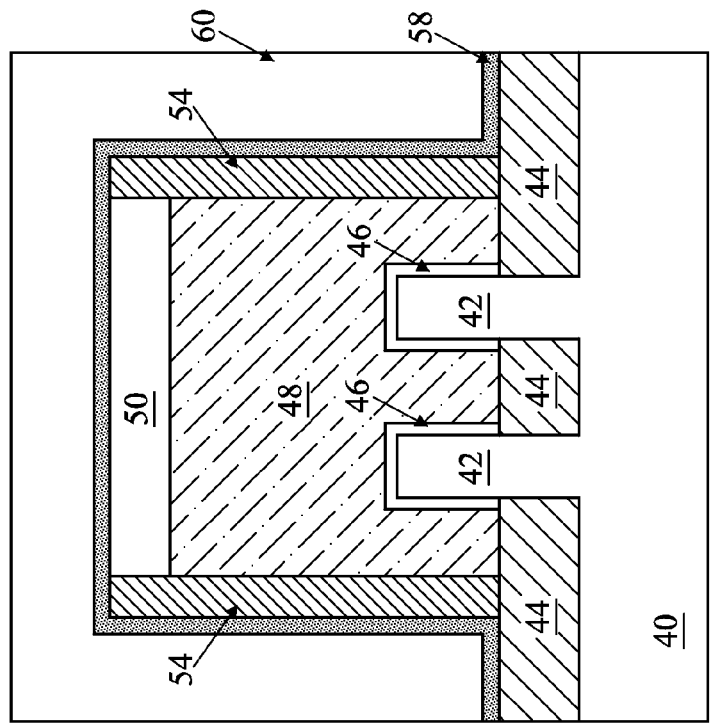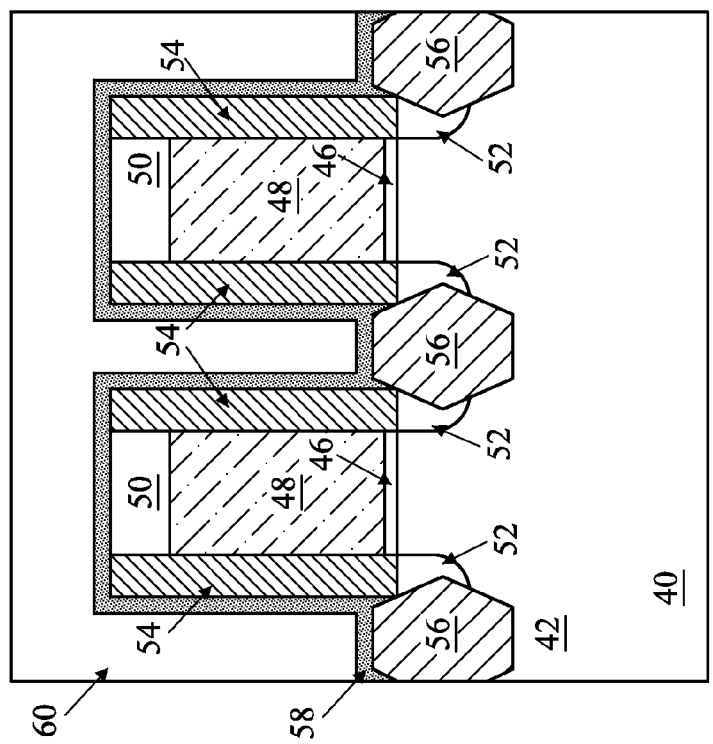
Fig. 5A
Fig. 5B

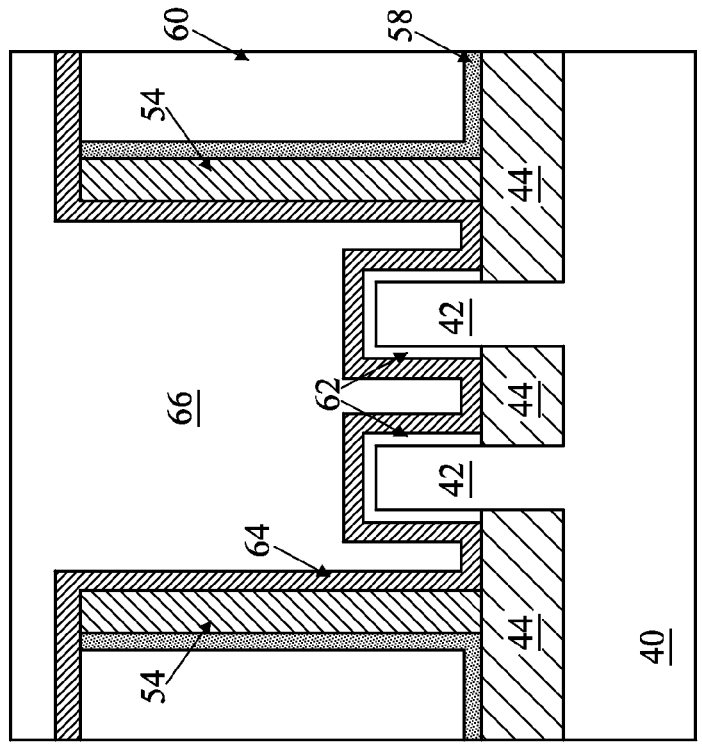
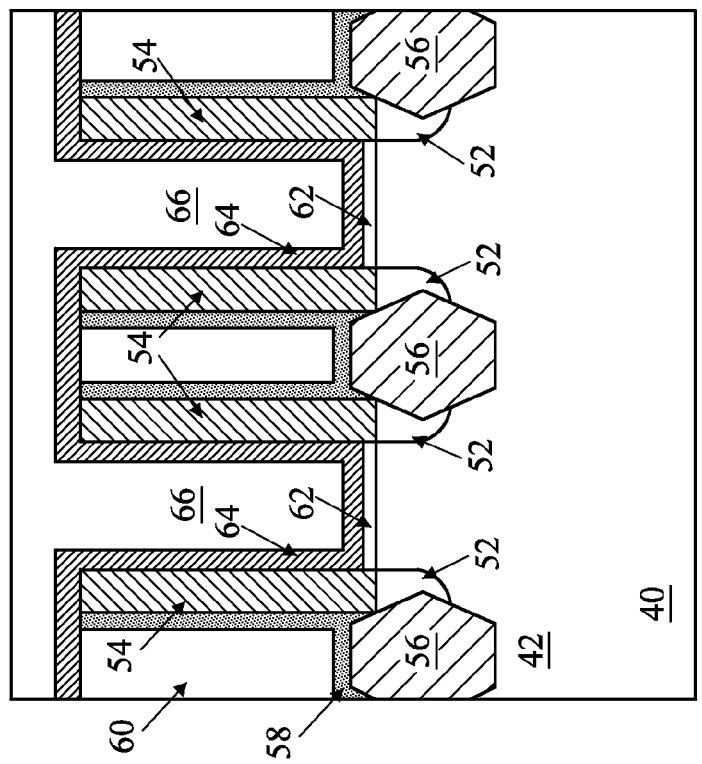
Fig. 6A
Fig. 6B

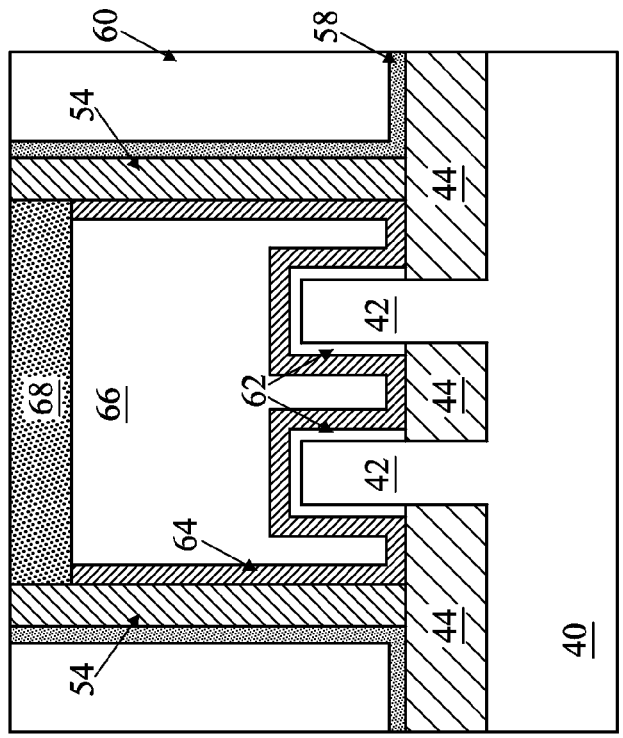
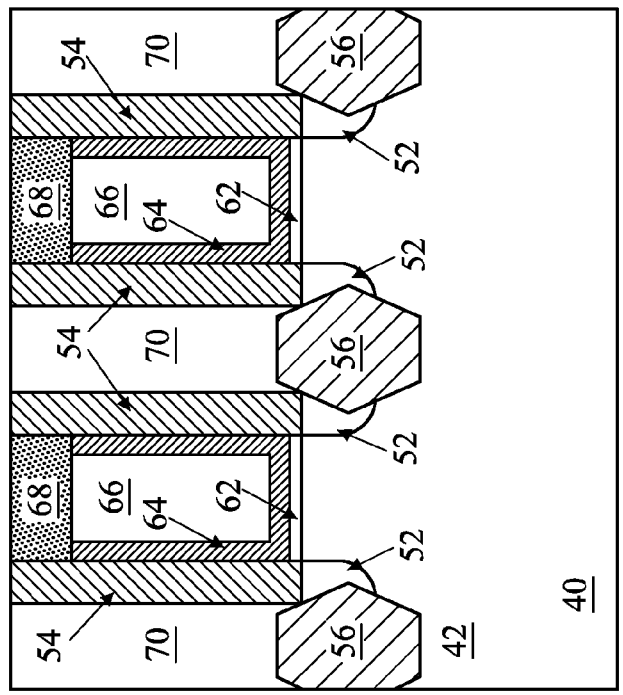
Fig. 8B
Fig. 8A

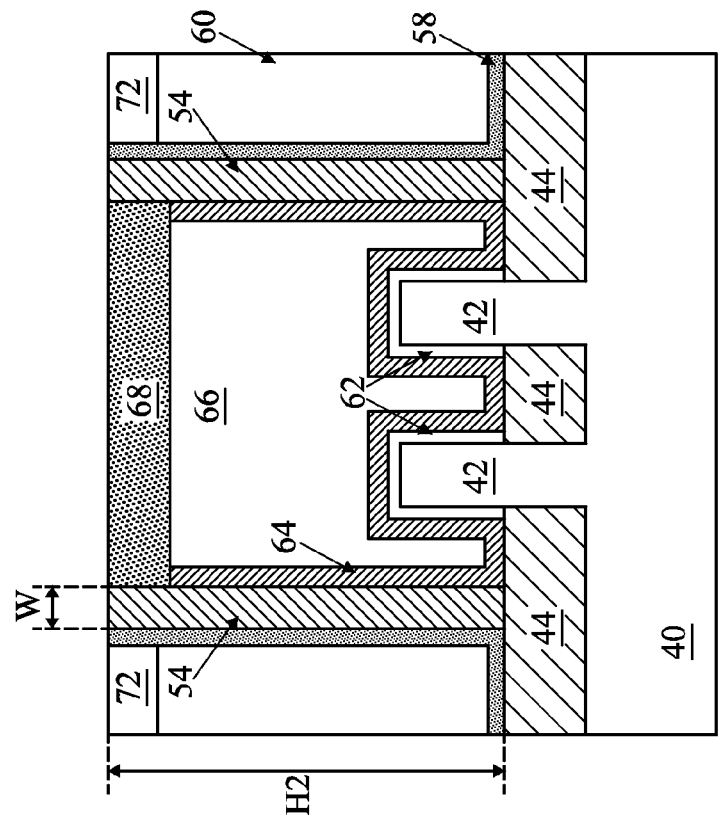
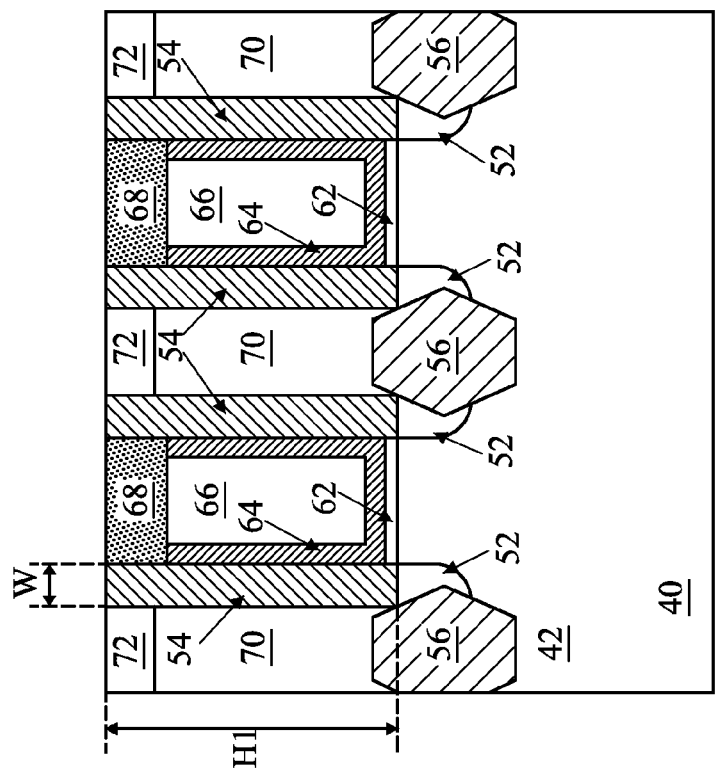
Fig. 9A
Fig. 9B

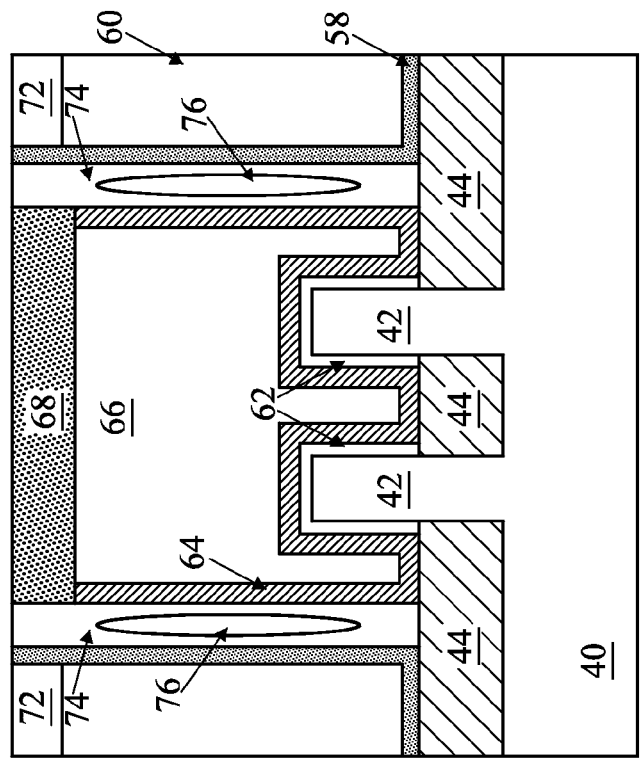
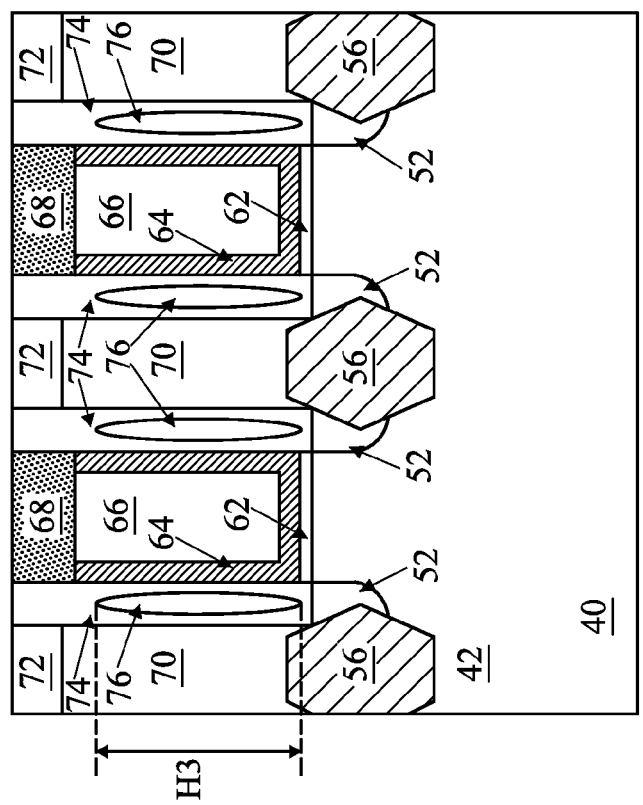
Fig. 10A
Fig. 10B

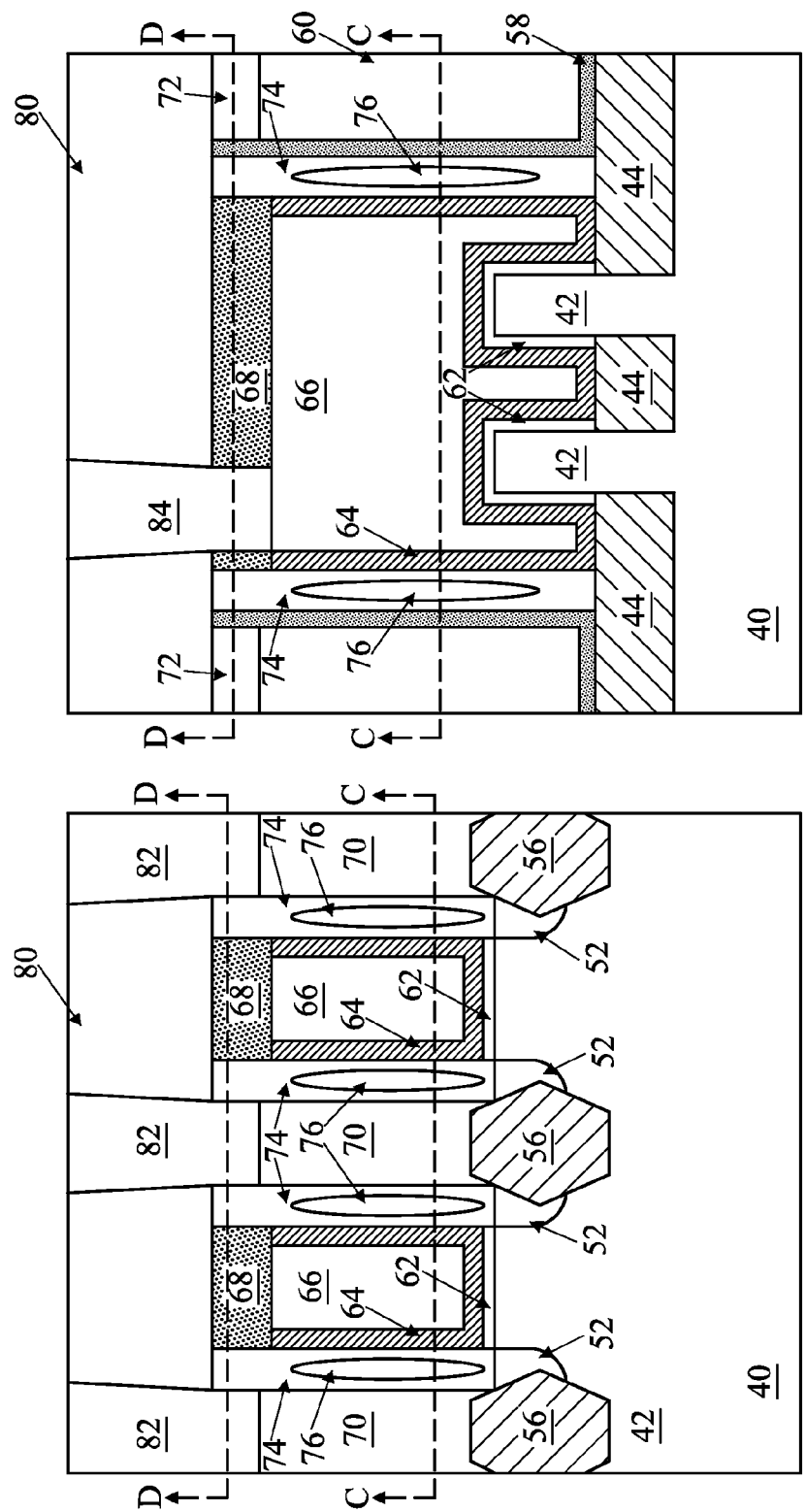

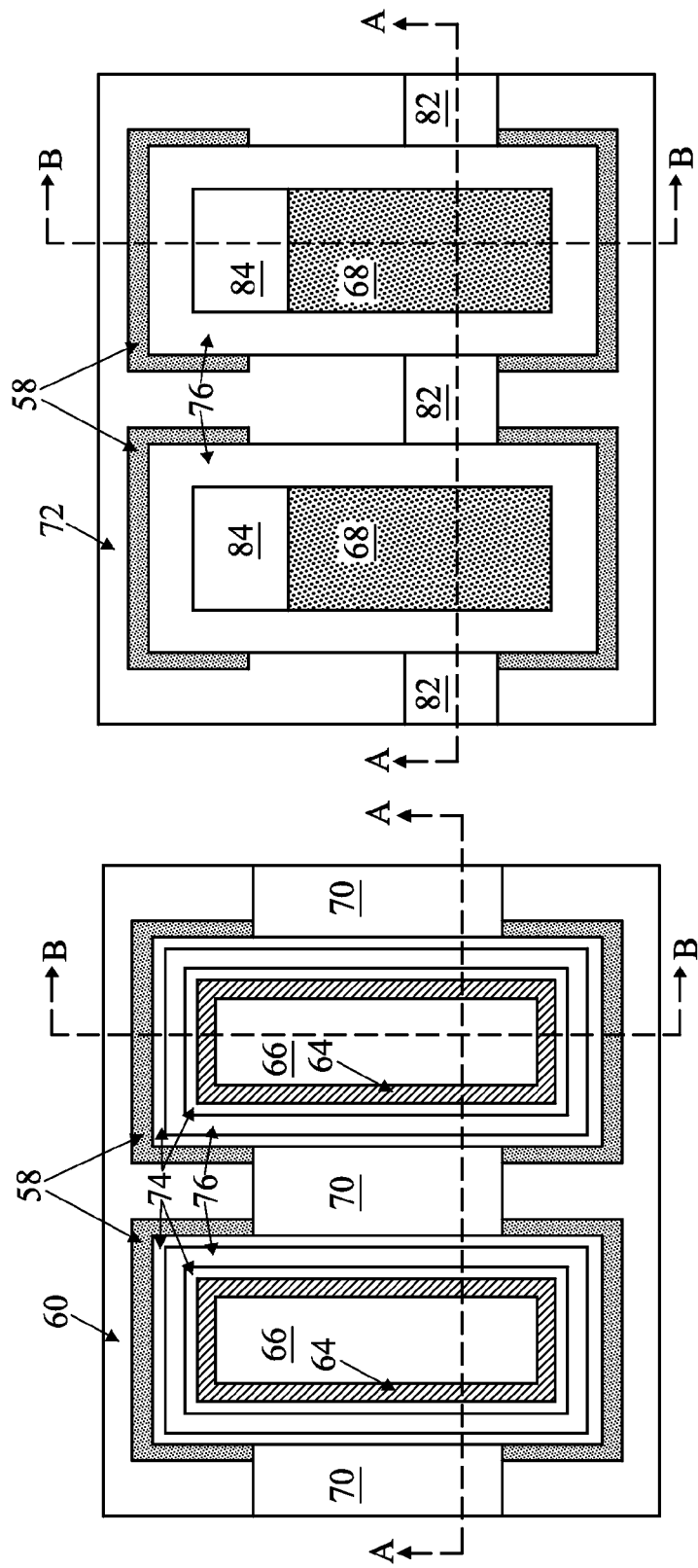

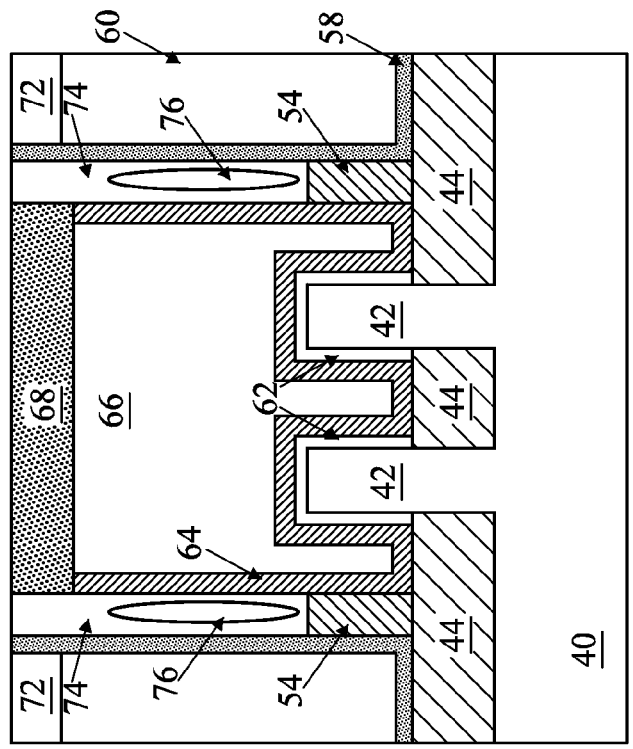
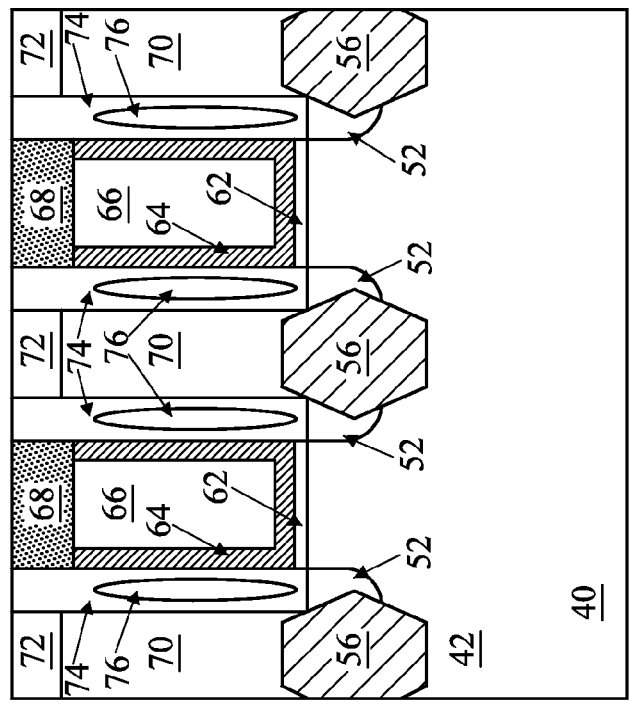
Fig. 12A
Fig. 12B

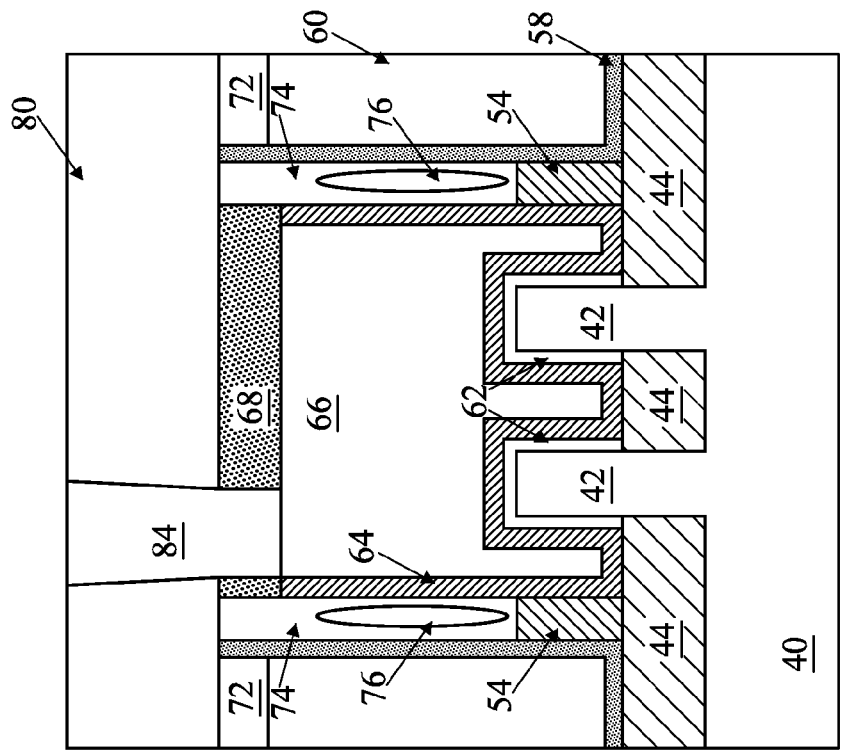
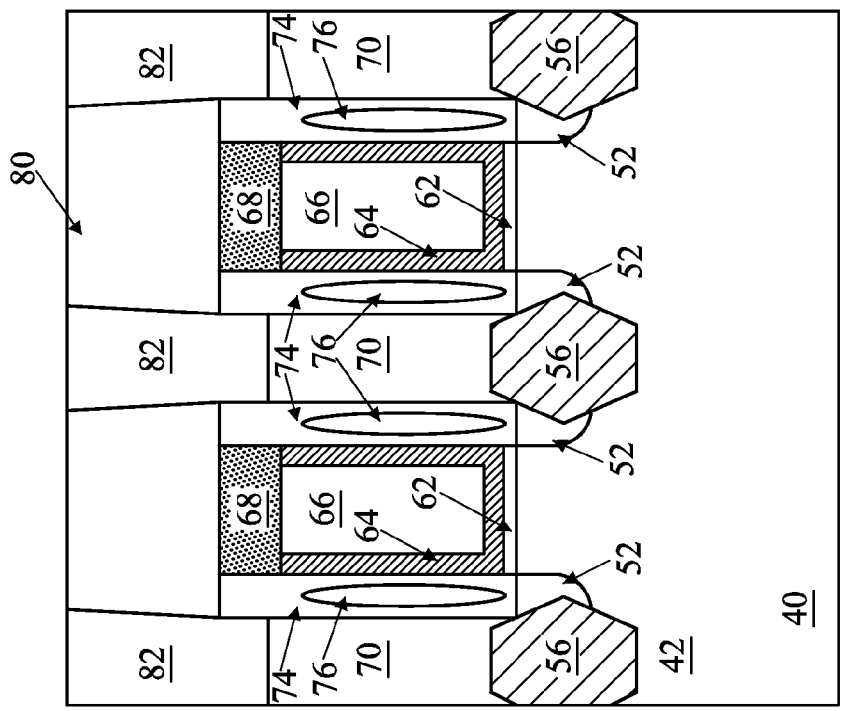
Fig. 13B
Fig. 13A

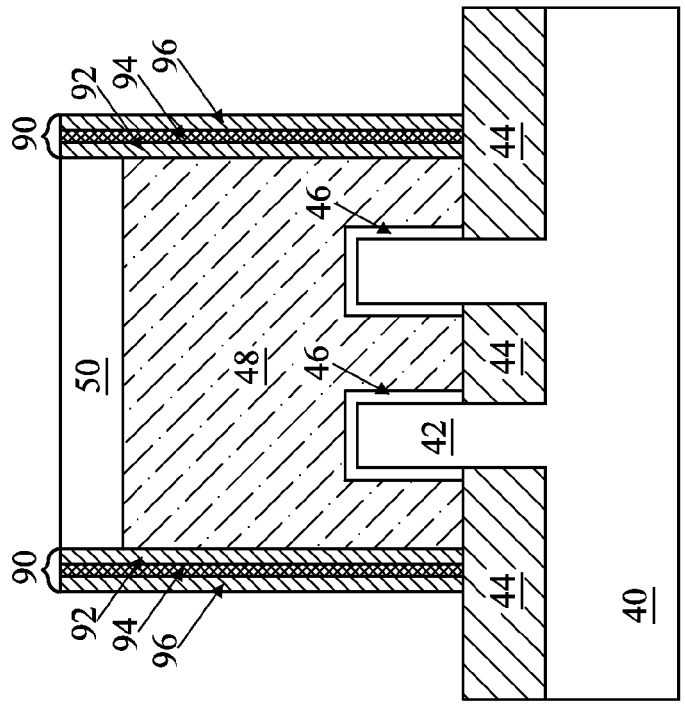
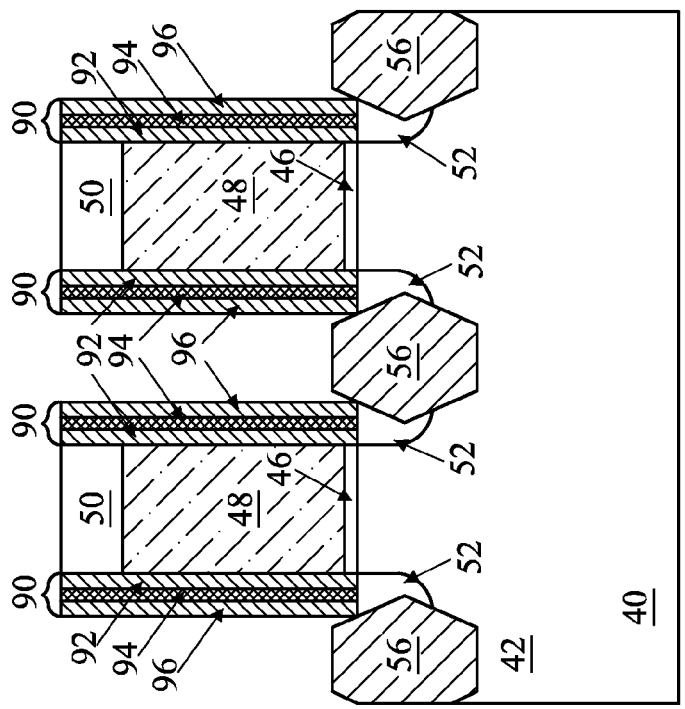
Fig. 14A
Fig. 14B

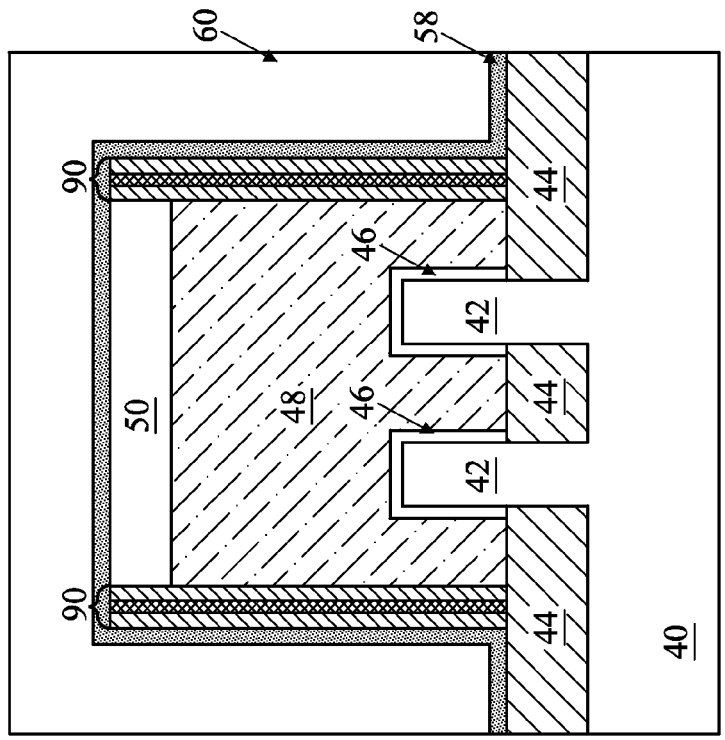
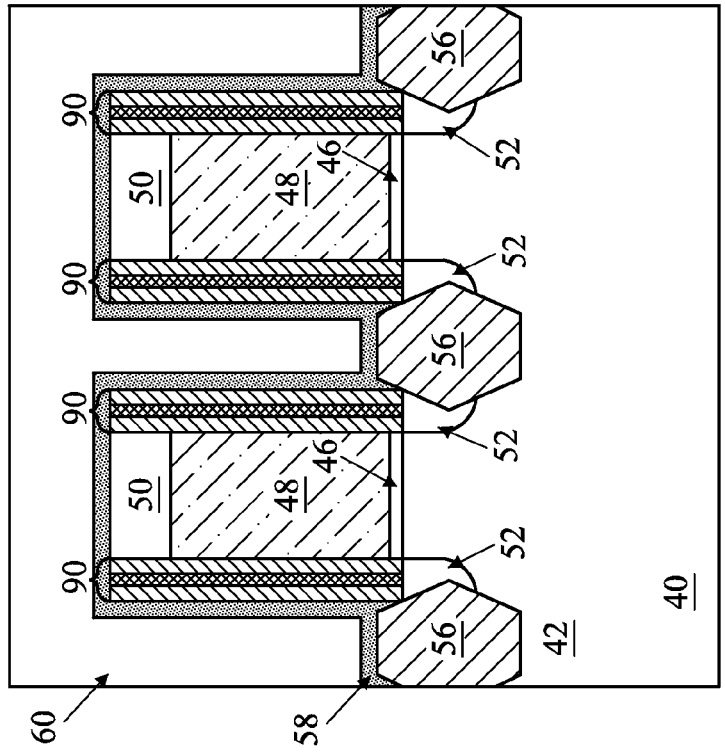
Fig. 15A
Fig. 15B

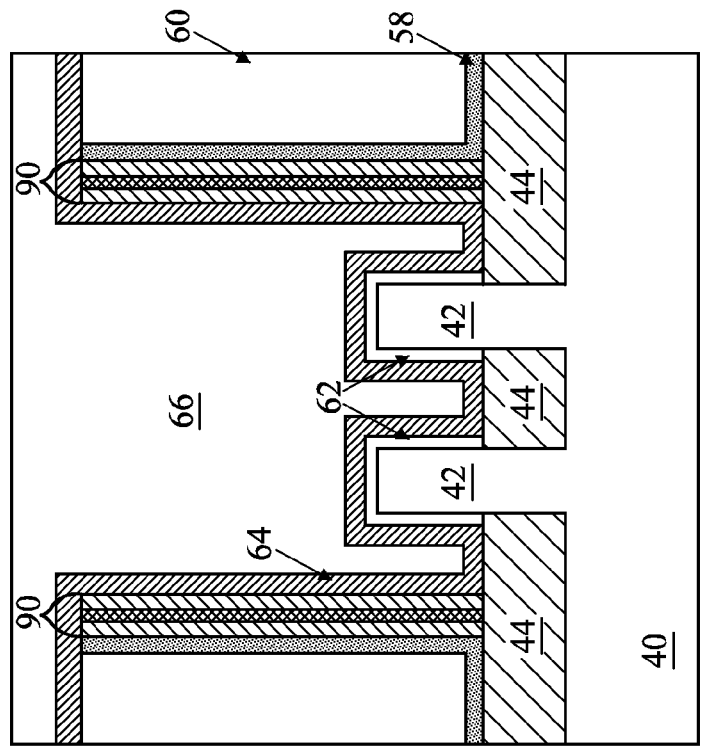
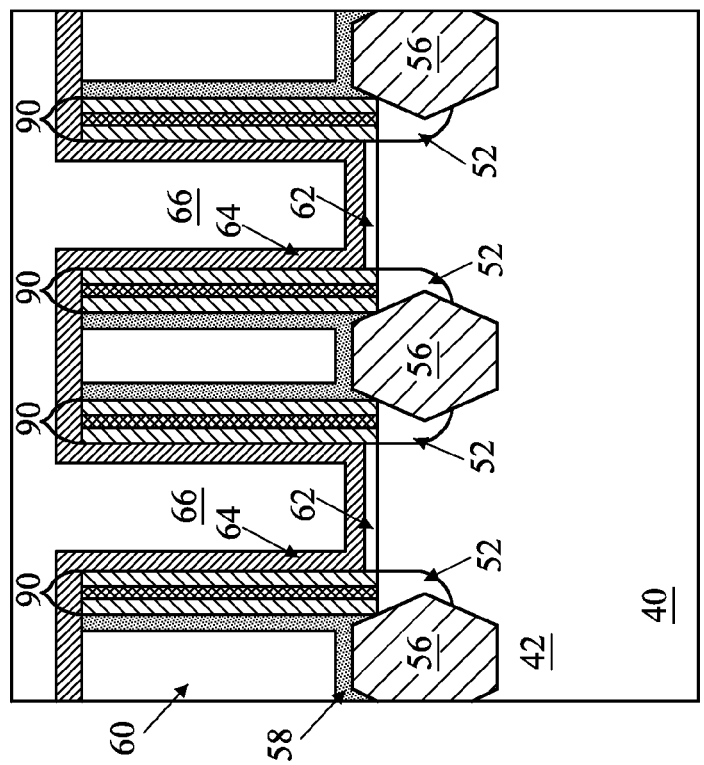

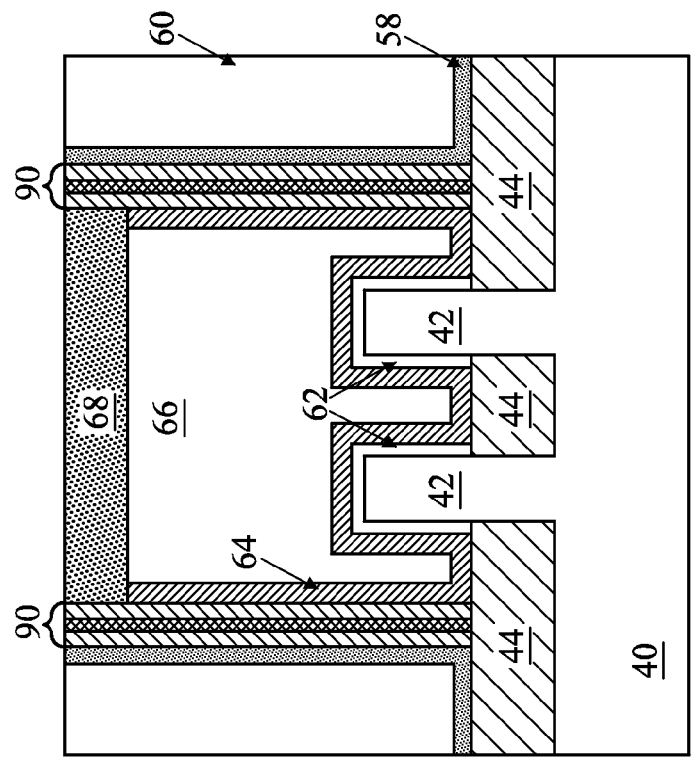
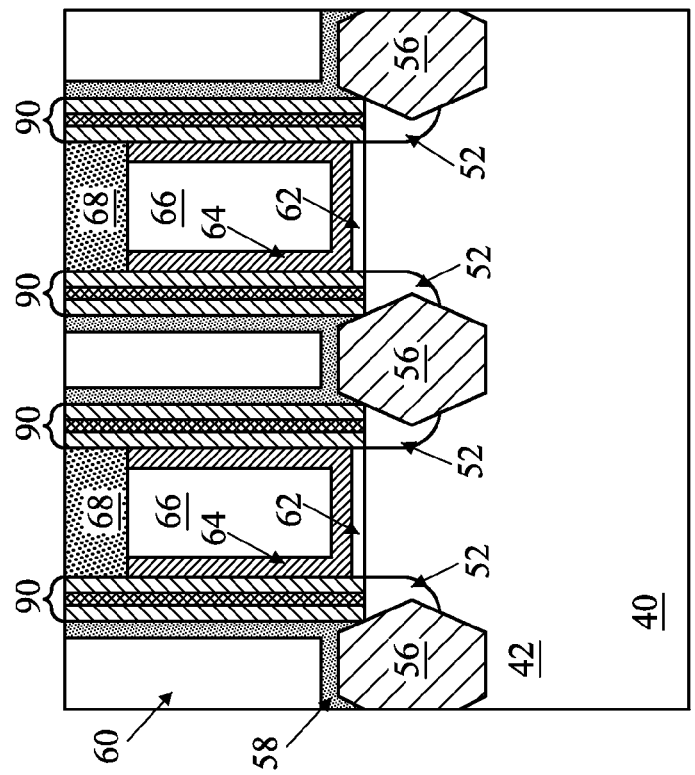

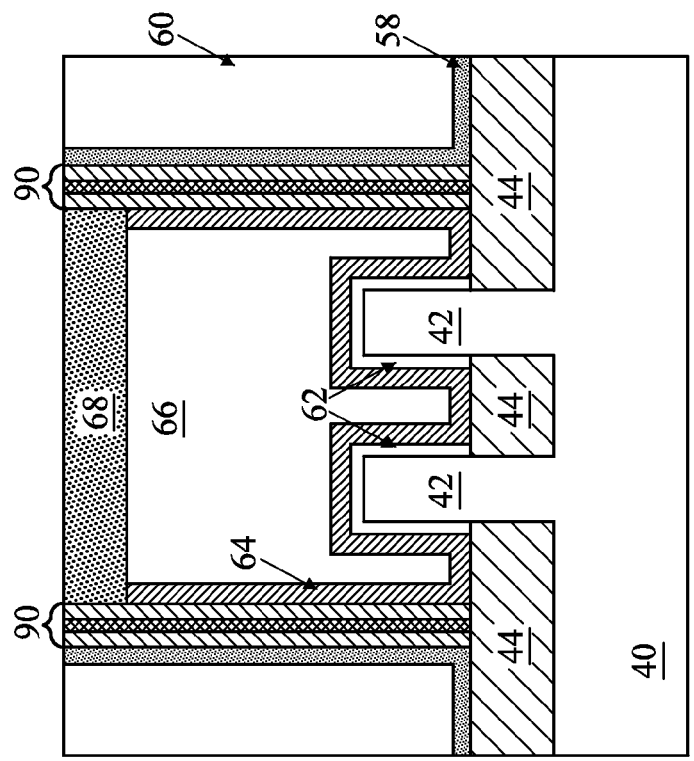
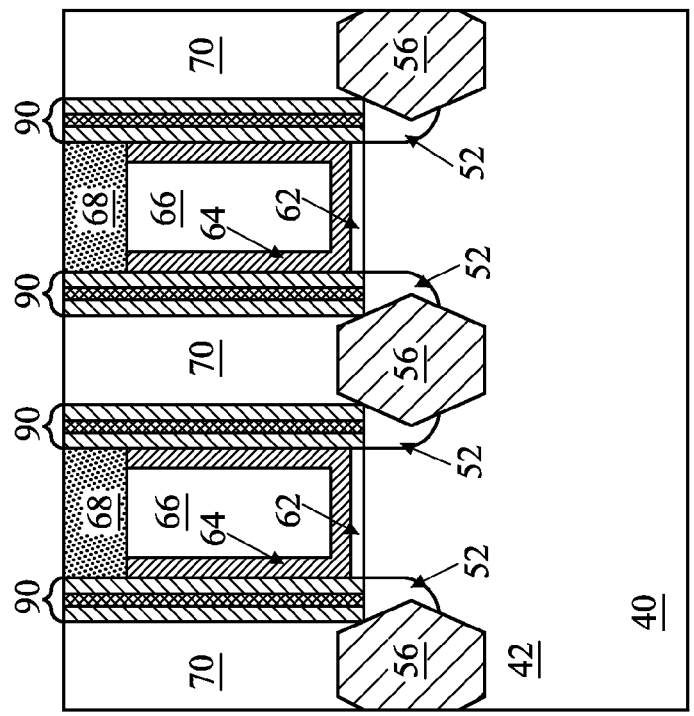
Fig. 18A
Fig. 18B

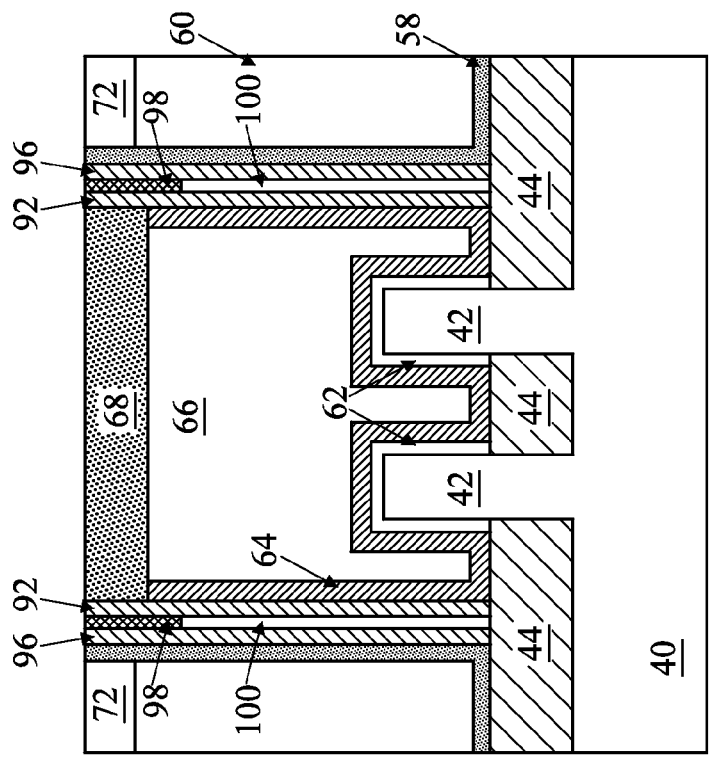
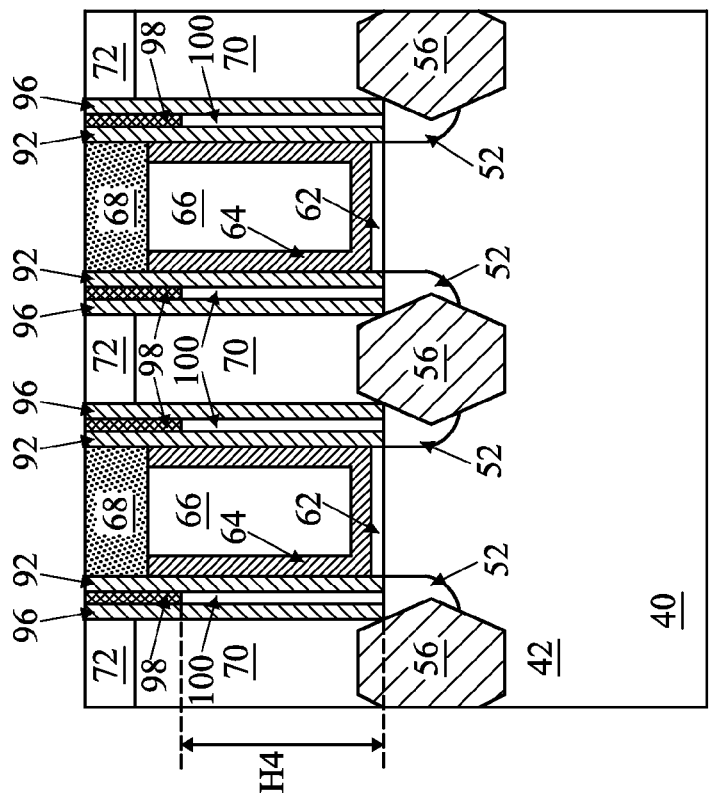
Fig. 20A
Fig. 20B

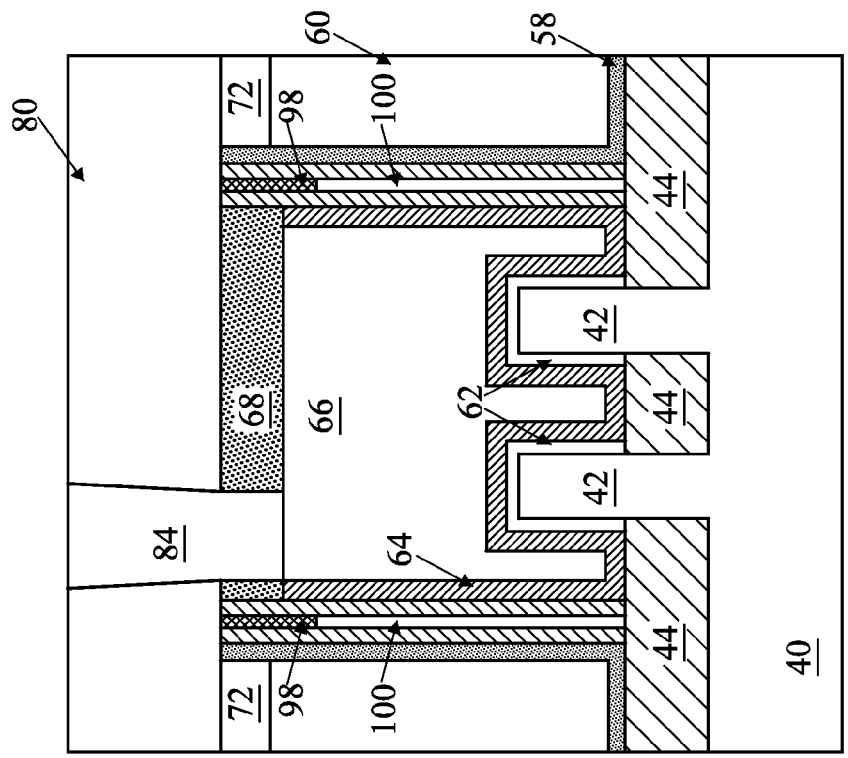
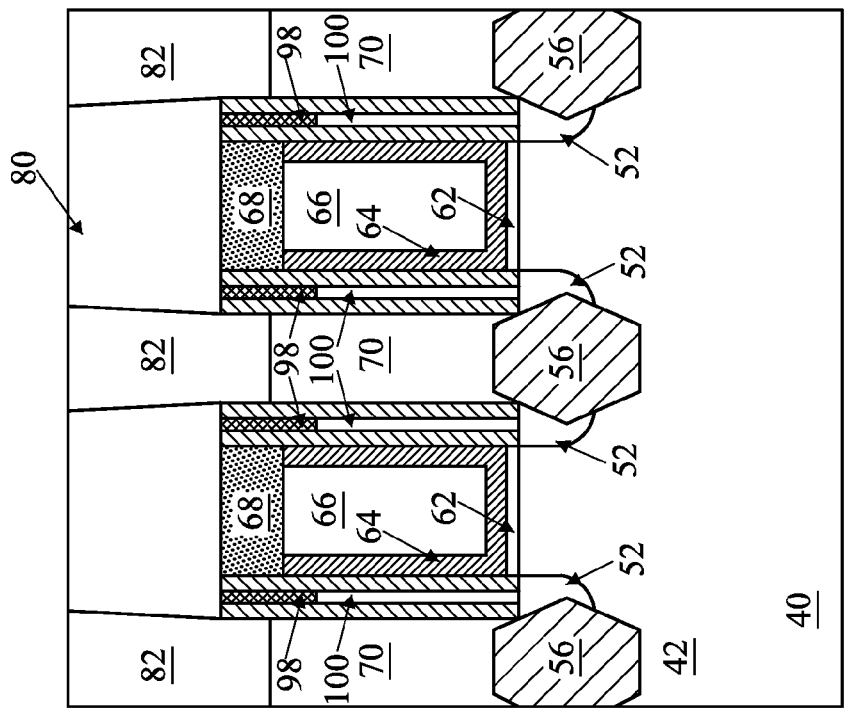
Fig. 21A
Fig. 21B

DEVICES INCLUDING GATE SPACER WITH GAP OR VOID AND METHODS OF FORMING THE SAME

BACKGROUND

Semiconductor manufacturers face a constant challenge to comply with Moore's Law. Semiconductor manufacturers constantly strive to continually decrease feature sizes, such as sizes of active and passive devices, interconnecting wire widths and thicknesses, and power consumption as well as increase device density, wire density, and operating frequencies.

With decreased feature sized and increased density, conductive components within a device generally have become closer in proximity. In some instances, this decrease in proximity of conductive components can adversely impact parasitic capacitance within the device. Increases in parasitic capacitance can decrease device operational speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 3A, 3B, 4A, 4B, 5A, 5B, 6A, 6B, 7A, 7B, 8A, 8B, 9A, 9B, 10A, 10B, 11A, and 11B are cross-sectional views of intermediate stages in the manufacturing of finFETs in accordance with some embodiments.

FIGS. 11C and 11D are layout views of the structure illustrated in FIGS. 11A and 11B in accordance with some embodiments.

FIGS. 12A, 12B, 13A, and 13B are cross-sectional views of intermediate stages in the manufacturing of finFETs in accordance with some other embodiments.

FIGS. 14A, 14B, 15A, 15B, 16A, 16B, 17A, 17B, 18A, 18B, 19A, 19B, 20A, 20B, 21A, and 21B are cross-sectional views of intermediate stages in the manufacturing of finFETs in accordance with some further embodiments.

DETAILED DESCRIPTION

Figure 1:
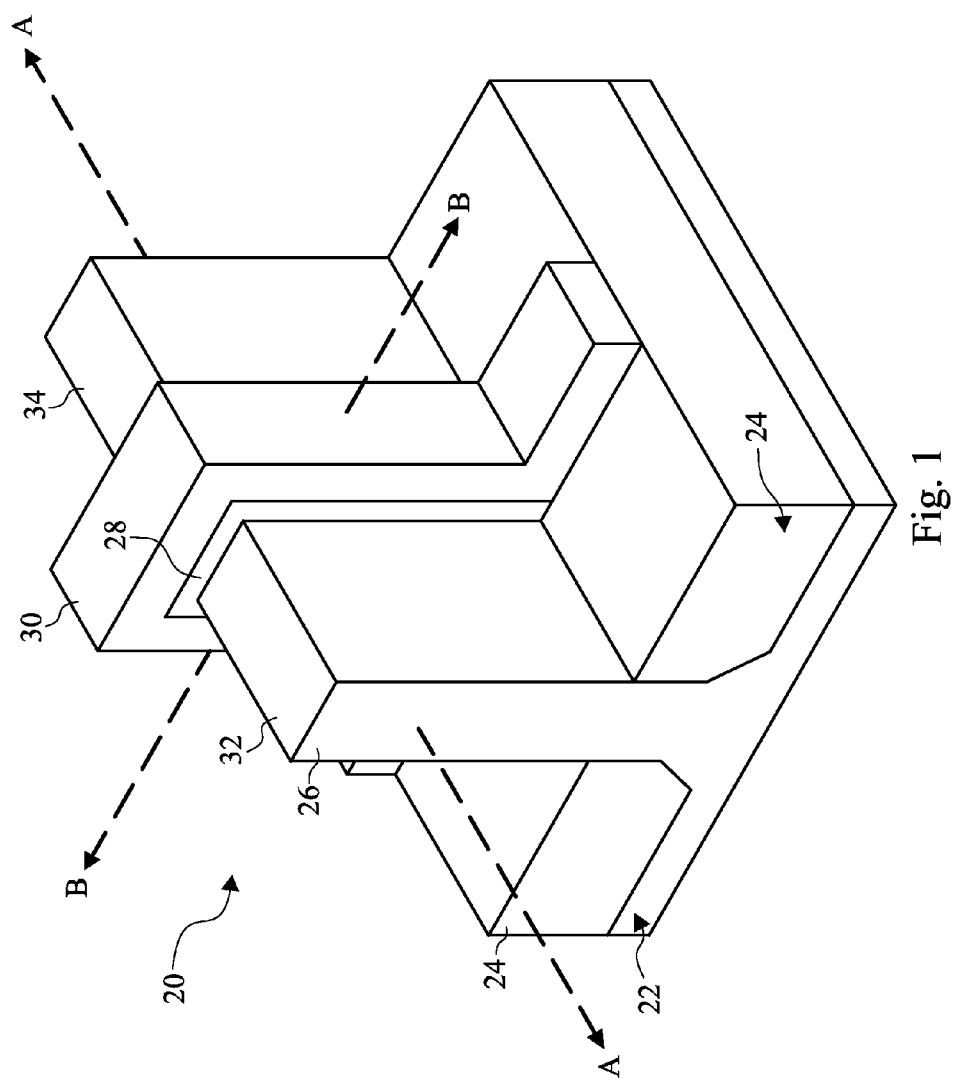
FIG. 1 is an example of a generic fin Field-Effect Transistor (finFET) in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (finFETs) and methods of forming the same are provided in accordance with various embodiments. Intermediate stages of forming finFETs are illustrated. Some embodiments discussed herein are discussed in the context of finFETs formed using a gate-last process. Some embodiments contemplate aspects used in planar devices, such as planar FETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a generic finFET 20 in a three-dimensional view. The finFET 20 comprises a fin 26 on a substrate 22. The substrate 22 includes isolation regions 24, and the fin 26 protrudes above and from between neighboring isolation regions 24. A gate dielectric 28 is along sidewalls and over a top surface of the fin 26, and a gate electrode 30 is over the gate dielectric 28. Source/drain regions 32 and 34 are disposed in opposite sides of the fin 26 with respect to the gate dielectric 28 and gate electrode 30. FIG. 1 further illustrates reference cross-sections that are used in later figures. Cross-section A-A is along a longitudinal axis of the fin 26 and in a direction of, for example, a current flow between the source/drain regions 32 and 34. Cross-section B-B is perpendicular to cross-section A-A and is across a channel, gate dielectric 28, and gate electrode 30 of the finFET 20. Subsequent figures refer to these reference cross-sections for clarity.

FIGS. 2A-B through 11A-B are cross-sectional views of intermediate stages in the manufacturing of finFETs in accordance with an exemplary embodiment. Figures ending with an "A" illustrate reference cross-section A-A illustrated in FIG. 1, except for multiple transistors in one fin. Figures ending with a "B" illustrate reference cross-section B-B illustrated in FIG. 1, except for multiple fins.

FIGS. 2A and 2B illustrate a substrate 40. The substrate 40 may be a semiconductor substrate, such as a bulk semiconductor substrate, a semiconductor-on-insulator (SOI) substrate, a multi-layered or gradient substrate, or the like. The substrate 40 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 40 may be doped or un-doped. In a specific example, the substrate 40 is a bulk silicon substrate.

FIGS. 3A and 3B illustrate the formation of fins 42 and isolation regions 44 between neighboring fins 42. In FIGS. 3A and 3B, fins 42 are formed in the substrate 40. In some embodiments, the fins 42 may be formed in the substrate 40 by etching trenches in the substrate 40. The etching may be any acceptable etch process, such as a reactive ion etch (RIE), neutral beam etch (NBE), the like, or a combination thereof. The etch may be anisotropic.

An insulation material is formed in the trenches and between neighboring fins 42 to form the isolation regions 44. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the insulation material and top surfaces of the fins 42 that are co-planar.

Although not specifically illustrated, appropriate wells may be formed in the fins 42 and/or substrate 40. For example, a p-well may be formed in a first region of the substrate 40 where n-type devices, such as n-type finFETs, are to be formed, and an n-well may be formed in a second region of the substrate 40 where p-type devices, such as p-type finFETs, are to be formed.

For example, to form a p-well in the first region, a photoresist can formed over the fins 42 and the insulation material in the second region of the substrate 40. The photoresist can be patterned to expose the first region of the substrate 40. The photoresist can be formed by using a spin-on technique and can be patterned using acceptable photolithography techniques. Once the photoresist is patterned, a p-type impurity implant can be performed in the first region, and the photoresist may act as a mask to substantially prevent p-type impurities from being implanted into the second region. The p-type impurities may be boron, $BF_2$, or the like implanted in the first region to a concentration of equal to or less than $10^{18}$ $cm^{-3}$, such as between about $10^{17}$ $cm^{-3}$ and about $10^{18}$ $cm^{-3}$. After the implant, the photoresist can be removed, such as by an acceptable ashing process.

Further, to form an n-well in the second region, a photoresist can be formed over the fins 42 and the insulation material in the first region of the substrate 40. The photoresist can be patterned to expose the second region of the substrate 40. The photoresist can be formed by using a spin-on technique and can be patterned using acceptable photolithography techniques. Once the photoresist is patterned, an n-type impurity implant may be performed in the second region, and the photoresist may act as a mask to substantially prevent n-type impurities from being implanted into the first region. The n-type impurities may be phosphorus, arsenic, or the like implanted in the second region to a concentration of equal to or less than $10^{18}$ $cm^{-3}$, such as between about $10^{17}$ $cm^{-3}$ and about $10^{18}$ $cm^{-3}$. After the implant, the photoresist can be removed, such as by an acceptable ashing process. After the implants, an anneal may be performed to activate the p-type and n-type impurities that were implanted. The implantations may form a p-well in the first region and an n-well in the second region.

The insulation material is recessed to form the isolation regions 44, which may be Shallow Trench Isolation (STI) regions. The insulation material is recessed such that fins 42 protrude from between neighboring isolation regions 44. The recessing may use an acceptable etching process, such as one that is selective to the material of the isolation regions 44. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2A, 2B, 3A, and 3B is just one example of how fins may be formed. In other embodiments, a dielectric layer can be formed over a top surface of the substrate 40; trenches can be etched through the dielectric layer; epitaxial fins can be epitaxially grown in the trenches; and the dielectric layer can be recessed such that the homoepitaxial and/or heteroepitaxial structures protrude from the dielectric layer to form epitaxial fins. It may be advantageous to epitaxially grow a material or epitaxial fin structure for n-type finFETs different from the material or epitaxial fin structure for p-type finFETs.

Figure 4B:
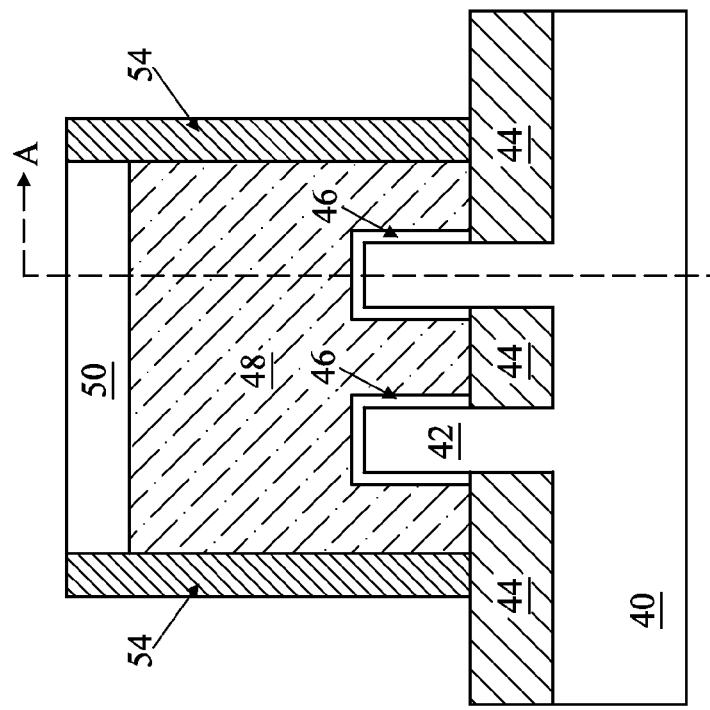
Figure 4A:
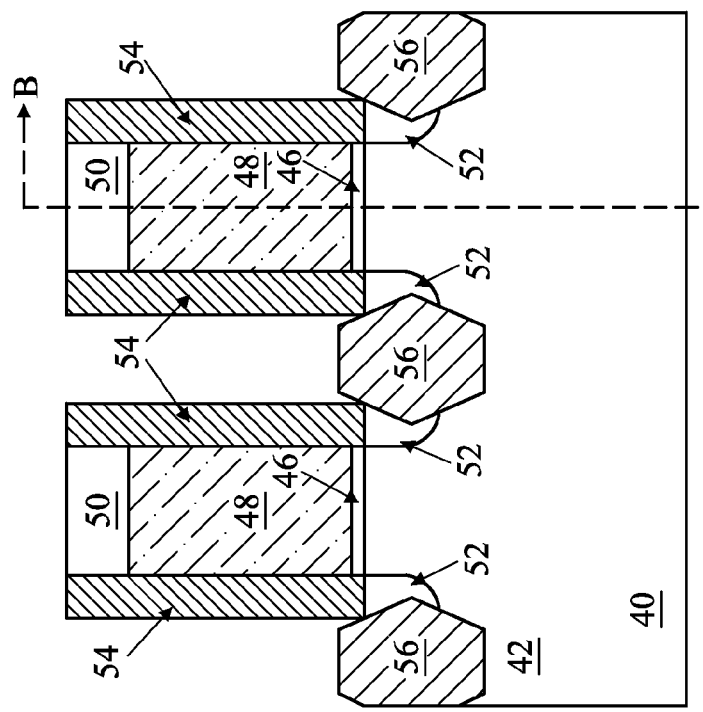

In FIGS. 4A and 4B, a dummy dielectric layer is formed on the fins 42. The dummy dielectric layer may be, for example, silicon oxide, silicon nitride, a combination thereof, or the like, and may be deposited or thermally grown according to acceptable techniques, such as CVD, thermal oxidation, or the like. A dummy gate layer is formed over the dummy dielectric layer. The dummy gate layer may be deposited, such as by using CVD or the like, over the dummy dielectric layer and then planarized, such as by a CMP. The dummy gate layer may comprise, for example, polysilicon, although other materials that have a high etching selectivity may also be used. A mask layer is formed over the dummy gate layer. The mask layer may be deposited, such as by using CVD or the like, over the dummy gate layer. The mask layer may comprise, for example, silicon nitride, silicon oxynitride, silicon carbon nitride, or the like.

The mask layer may be patterned using acceptable photolithography and etching techniques to form masks 50. The pattern of the masks 50 then may be transferred to the dummy gate layer and dummy dielectric layer by an acceptable etching technique to form dummy gates 48 and dummy gate dielectrics 46 from the dummy gate layer and the dummy dielectric layer, respectively. The etching may comprise an acceptable anisotropic etching, such as RIE, NBE, or the like. The dummy gates 48 cover respective channel regions of the fins 42. The dummy gates 48 may also have a lengthwise direction substantially perpendicular to the lengthwise direction of respective fins 42.

Implants for lightly doped source/drain (LDD) regions 52 may be performed. Similar to the implants discussed above, a mask, such as a photoresist, may be formed over the second region, e.g., for p-type devices, while exposing the first region, e.g., for n-type devices, and n-type impurities may be implanted into the exposed fins 42 in the first region. The mask may then be removed. Subsequently, a mask, such as a photoresist, may be formed over the first region while exposing the second region, and p-type impurities may be implanted into the exposed fins 42 in the second region. The mask may then be removed. The n-type impurities may be any of the n-type impurities previously discussed, and the p-type impurities may be any of the p-type impurities previously discussed. The LDD regions 52 may have a concentration of impurities from about $10^{15}$ $cm^{-3}$ to about $10^{16}$ $cm^{-3}$. An anneal may be used to activate the implanted impurities.

Further in FIGS. 4A and 4B, dummy gate spacers 54 are formed along sidewalls of the dummy gates 48, dummy gate dielectrics 46, and masks 50. The dummy gate spacers 54 may be formed by conformally depositing, such as by CVD or the like, a layer and subsequently anisotropically etching the layer. The material of the dummy gate spacers 54 may be any appropriate material, such as aluminum oxide ($Al_2O_3$) or the like, that can be selectively etched relative to other components, as will be discussed subsequently.

Epitaxial source/drain regions 56 are formed in the source/drain regions of the fins 42. The epitaxial source/drain regions 56 are formed in the source/drain regions of the fins 42 such that each dummy gate 48 is disposed between ones of a respective pair of the epitaxial source/drain regions 56 in the fin 42.

The epitaxial source/drain regions 56 in the first region, e.g., for n-type devices, may be formed by masking, such as with a hard mask, the second region, e.g., for p-type devices. Then, source/drain regions of the fins 42 in the first region are etched to form recesses. The etch may be any appropriate etch selective to the fins 42 and may be anisotropic. The epitaxial source/drain regions 56 in the first region are then epitaxially grown in the recesses. The epitaxial growth may be by using Metal-Organic CVD (MOCVD), Molecular Beam Epitaxy (MBE), Liquid Phase Epitaxy (LPE), Vapor Phase Epitaxy (VPE), the like, or a combination thereof. The epitaxial source/drain regions 56 in the first region may comprise any acceptable material, such as appropriate for n-type finFETs. For example, the epitaxial source/drain regions 56 in the first region may comprise silicon, SiC, SiCP, SiP, or the like. The epitaxial source/drain regions 56 may have surfaces raised from respective outer surfaces of the fins 42 and may have facets. The mask may then be removed, such as by using an etch selective to the material of the mask.

The epitaxial source/drain regions 56 in the second region may be formed by masking, such as with a hard mask, the first region. Then, source/drain regions of the fins 42 in the second region are etched to form recesses. The etch may be any appropriate etch selective to the fins 42 and may be anisotropic. The epitaxial source/drain regions 56 in the second region are then epitaxially grown in the recesses. The epitaxial growth may be by using MOCVD, MBE, LPE, VPE, the like, or a combination thereof. The epitaxial source/drain regions 56 in the second region may comprise any acceptable material, such as appropriate for p-type finFETs. For example, the epitaxial source/drain regions 56 in the second region may comprise SiGe, SiGeB, Ge, GeSn, or the like. The epitaxial source/drain regions 56 may have surfaces raised from respective outer surfaces of the fins 42 and may have facets. The mask may then be removed, such as by using an etch selective to the material of the mask.

The epitaxial source/drain regions 56 and/or source/drain regions of the fins 42 may be implanted with dopants, similar to the process previously discussed for forming LDD regions 52, followed by an anneal. The source/drain regions may have an impurity concentration of between about $10^{19}$ $cm^{-3}$ and about $10^{21}$ $cm^{-3}$. The n-type impurities for source/drain regions in the first region, e.g., for n-type devices, may be any of the n-type impurities previously discussed, and the p-type impurities for source/drain regions in the second region, e.g., for p-type devices, may be any of the p-type impurities previously discussed. In other embodiments, the epitaxial source/drain regions 56 may be in situ doped during growth.

FIG. 4A illustrates cross-section B-B that is the cross-section illustrated by FIG. 4B, and FIG. 4B illustrates cross-section A-A that is the cross-section illustrated by FIG. 4A. These relationships between the depicted cross-sections in FIGS. 4A and 4B continue through the following figures although not specifically illustrated subsequently.

In FIGS. 5A and 5B, an etch stop layer (ESL) 58 is conformally formed on epitaxial source/drain regions 56, dummy gate spacers 54, masks 50, and isolation regions 44. In some embodiments, the ESL 58 may comprise silicon nitride, silicon carbonitride, or the like, formed using Atomic Layer Deposition (ALD), chemical vapor deposition (CVD), the like, or a combination thereof. A bottom inter-layer dielectric (ILD0) 60 is deposited over the ESL 58. ILD0 60 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

In FIGS. 6A and 6B, a planarization process, such as a CMP, is performed to level the top surface of ILD0 60 with the top surfaces of the dummy gates 48. The CMP may also remove the masks 50 and the ESL 58 from over the dummy gates 48. Accordingly, top surfaces of the dummy gates 48 are exposed through the ILD0 60. The dummy gates 48 and the dummy gate dielectrics 46 are removed in an etching step(s), so that openings through the ILD0 60 and defined by the dummy gate spacers 54 are formed to the fins 42. Each opening exposes a channel region of a respective fin 42. Each channel region is disposed between ones of neighboring pairs of epitaxial source/drain regions 56. The etching step(s) may be selective to the materials of the dummy gates 48 and the dummy gate dielectrics 46, which etching may be a dry or wet etching. During the etching, the dummy gate dielectrics 46 may be used as an etch stop layer when the dummy gates 48 are etched. The dummy gate dielectric 46 may then be etched after the removal of the dummy gates 48.

An interfacial dielectric 62 is formed in each opening and on the fins 42. The interfacial dielectric 62 may be, for example, an oxide or the like formed by thermal oxidation or the like. A gate dielectric layer 64 is then formed conformally on the top surface of the ILD0 60 and in the openings along sidewalls of the dummy gate spacers 54 and on the interfacial dielectric 62. In some embodiments, the gate dielectric layer 64 comprises a high-k dielectric material, and in these embodiments, the gate dielectric layer 64 may have a k value greater than about 7.0, and may include a metal oxide or a silicate of Hf, Al, Zr, La, Mg, Ba, Ti, Pb, and combinations thereof. The formation methods of gate dielectric layer 64 may include ALD, CVD, Molecular-Beam Deposition (MBD), the like, or a combination thereof.

A gate electrode 66 is formed on the gate dielectric layer 64 and in the openings. The gate electrode 66 may comprise a single material or any combination of layers and different materials as may be appropriate. For example, the gate electrode material may comprise a capping layer, one or more work function tuning layers, one or more barrier layer, and one or more metal.

A capping layer can be formed conformally on the gate dielectric layer 64. The capping layer can comprise a first sub-layer and a second sub-layer. In some embodiments, the capping layer may be a single layer or may comprise additional sub-layers. The capping layer may function as a barrier layer to prevent a subsequently deposited metal-containing material from diffusing into the gate dielectric layer 64. Further, the second sub-layer can function as an etch stop during the formation of work function tuning layers in various regions if the first sub-layer is formed from a same material as the work function tuning layers and if different work function tuning layers are to be formed in the various regions. The first sub-layer can comprise titanium nitride (TiN) or the like deposited conformally on the gate dielectric layer 64 by ALD, CVD, or the like. The second sub-layer can comprise tantalum nitride (TaN) or the like deposited conformally on the first sub-layer by ALD, CVD, or the like.

One or more work function tuning layer can be formed conformally on the capping layer, e.g., on the second sub-layer. The first work function tuning layer may be any acceptable material to tune a work function of a device to a desired amount given the application of the device to be formed, and may be deposited using any acceptable deposition process. In some embodiments, the work function tuning layer comprises titanium aluminum (TiAl), titanium nitride (TiN), or the like deposited by ALD, CVD, or the like.

A metal can be deposited in the openings on the work function tuning layer(s). The metal can be an elemental metal, an alloy of metals, multiple layers of elemental metal, or a combination thereof, and can include tungsten (W), aluminum (Al), cobalt (Co), ruthenium (Ru), a combination thereof or the like. The metal can be deposited using CVD, physical vapor deposition (PVD), the like, or a combination thereof. The metal at least fills the remaining portions of the openings.

Figure 7B:
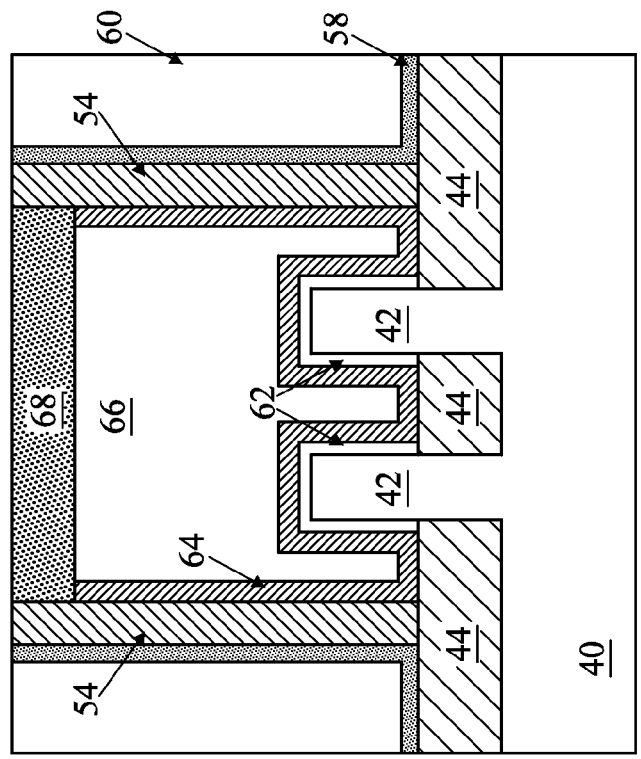
Figure 7A:
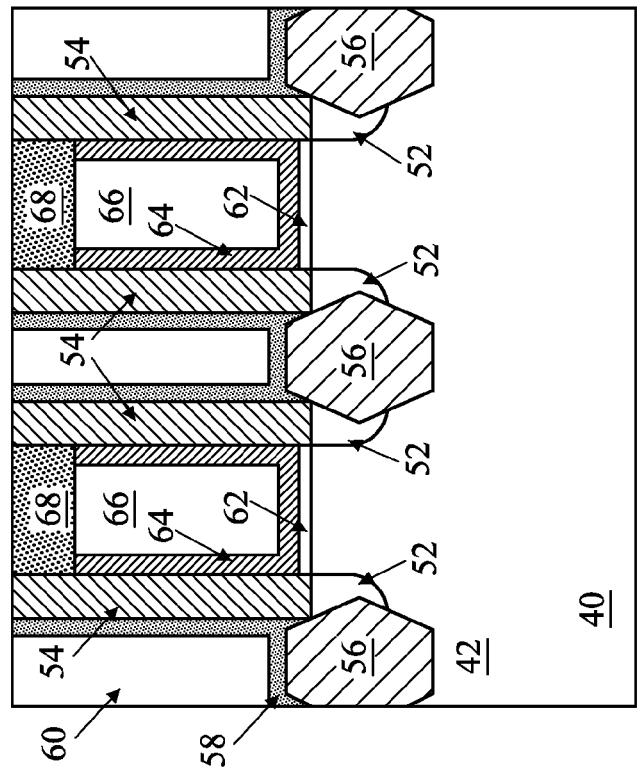
Figures 19A, 19B:
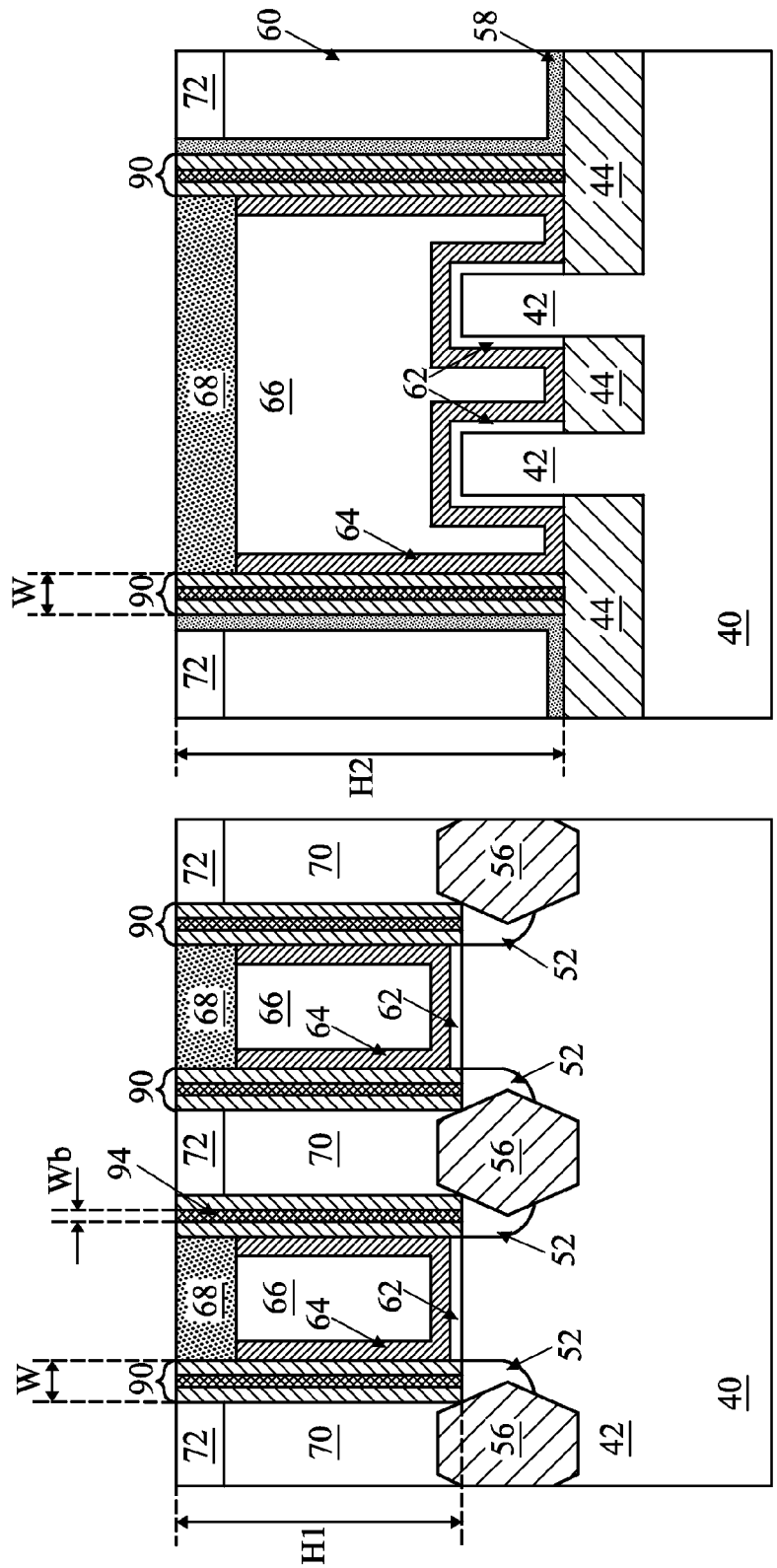

In FIGS. 7A and 7B, a planarization process, such as a CMP, may be performed to remove the excess portions of the gate electrode 66 and gate dielectric layer 64, which excess portions are over the top surface of ILD0 60. Then, a controlled etch-back selective to the gate electrode 66 and gate dielectric layer 64 is performed to recess the gate electrode 66 and gate dielectric layer 64 from the top surface of the ILD0 60. First dielectric caps 68 are then formed on the gate electrode 66 and gate dielectric layer 64. To form the first dielectric caps 68, a first cap dielectric layer can be deposited in the remaining portions of the openings above the gate electrode 66 and gate dielectric layer 64 (e.g., after recessing the gate electrode 66 and gate dielectric layer 64) and on the top surface of the ILD0 60. The first cap dielectric layer may comprise silicon carbide, silicon nitride, silicon carbonitride, or the like, formed using CVD, PECVD, or the like. The first cap dielectric layer can include any appropriate material that allows for etch selectivity between the first dielectric caps 68 and the dummy gate spacers 54. In a specific example, the first dielectric caps 68 are silicon carbide (SiC), and the dummy gate spacers 54 are aluminum oxide ($Al_2O_3$). The first cap dielectric layer can then be planarized, such as by CMP, to form top surfaces co-planar with the top surface of the ILD0 60 thereby forming the first dielectric caps 68. A thickness of the first dielectric caps 68 can be in a range from about 3 nm to about 20 nm, such as about 5 nm.

In FIGS. 8A and 8B, lower contacts 70 are formed through the ILD0 60 and the ESL 58 to the epitaxial source/drain regions 56. Openings for the lower contacts 70 are formed through the ILD0 60 and the ESL 58. The openings may be formed using acceptable photolithography and etching techniques. The ESL 58 along the dummy gate spacers 54 at the opening may be removed by the etching, such as if the ESL 58 is sufficiently thin, as illustrated in FIG. 8A. A liner, such as a diffusion barrier layer or the like, and a conductive material are formed in the openings. The liner may include titanium, titanium nitride, tantalum, tantalum nitride, or the like. The conductive material may be tungsten, copper, a copper alloy, silver, gold, tungsten, aluminum, nickel, or the like. A planarization process, such as a CMP, may be performed to remove excess material from the top surfaces of the ILD0 60, dummy gate spacers 54 and the first dielectric caps 68. The remaining liner and conductive material form lower contacts 70 in the openings. An anneal process may be performed to form a silicide at the interface between the epitaxial source/drain regions 56 and the lower contacts 70.

In FIGS. 9A and 9B, a controlled etch-back selective to the lower contacts 70 is performed to recess the lower contacts 70 from the top surface of the dummy gate spacers 54 and the first dielectric caps 68. As illustrated, the recessing can also recess the ILD0 60. Second dielectric caps 72 are then formed on the lower contacts 70. To form the second dielectric caps 72, a second cap dielectric layer can be deposited in the recesses formed by recessing the lower contacts 70 and on the ILD0 60. The second cap dielectric layer may comprise silicon nitride, silicon carbonitride, silicon carbide, or the like, formed using CVD, PECVD, or the like. The second cap dielectric layer can include any appropriate material that allows for etch selectivity between the first dielectric caps 68, the second dielectric caps 72, and the dummy gate spacers 54. Continuing the specific example where the first dielectric caps 68 and the dummy gate spacers 54 are silicon carbide (SiC) and aluminum oxide ($Al_2O_3$), respectively, the second dielectric caps 72 are silicon nitride (SiN). The second cap dielectric layer can then be planarized, such as by CMP, to form top surfaces co-planar with the top surfaces of the dummy gate spacers 54 and the first dielectric caps 68 thereby forming the second dielectric caps 72. A thickness of the second dielectric caps 72 can be in a range from about 3 nm to about 20 nm, such as about 5 nm.

After processing through FIGS. 9A and 9B, the dummy gate spacers 54 can have a width W, a first height H1, and a second height H2. The width W can correspond to the thickness of the layer that was deposited and subsequently etched to form the dummy gate spacers 54. The width W can be in a range from about 1 nm to about 5 nm, such as about 3 nm. The first height H1 is from a top surface of the fins 42 to a top surface of the dummy gate spacers 54. The first height H1 can be in a range from about 30 nm to about 80 nm, such as about 50 nm. The second height H2 is from a top surface of the isolation regions 44 to the top surface of the dummy gate spacers 54. The second height H2 can be in a range from about 80 nm to about 130 nm, such as about 100 nm. A first aspect ratio of the width W to the first height H1 can be in a range from about 6 to about 80, such as about 17. A second aspect ratio of the width W to the second height H2 can be in a range from about 16 to about 130, such as about 33.

In FIGS. 10A and 10B, the dummy gate spacers 54 are removed, and gate spacers 74 with respective gaps or voids 76 are formed where the dummy gate spacers 54 were removed. The dummy gate spacers 54 may be removed using an appropriate etch selective to the material of the dummy gate spacers 54, which etch may not significantly etch the first dielectric caps 68 and the second dielectric caps 72. The etch may be, for example, a wet etch, and may be isotropic. The entirety of the dummy gate spacers 54 may be removed, which is what is depicted in FIGS. 10A and 10B. In other words, the dummy gate spacers 54 are removed from along the entire second height H2. The removal of the dummy gate spacers 54 results in an opening encircling each gate stack (e.g., a combination of a respective gate dielectric layer 64 and gate electrode 66), and between each gate stack and a respective adjacent lower contact 70 and/or remaining portions of the ILD0 60. In this embodiment, the openings have aspect ratios corresponding to the aspect ratios of the dummy gate spacers 54 that were previously discussed.

The gate spacers 74 are then formed in the openings. The gate spacers 74 can be an appropriate dielectric material, which may further be a low-k dielectric layer that has a dielectric constant (k) value less than 3.9, which may further be less than 2.0. In some embodiments, the dielectric material of the gate spacers 74 is silicon carbon oxynitride (SiCON), silicon oxycarbide (SiOC), or the like. The dielectric material of the gate spacers 74 can be selectively etched relative to the first dielectric caps 68 and the second dielectric caps 72. The gate spacers 74 can be formed using an appropriate deposition technique, such as ALD, CVD, or the like. The deposition may be substantially conformal such that a layer of the dielectric material of the gate spacers 74 is deposited with a substantially same thickness along the sidewalls and bottom surfaces of the openings. Due to the high aspect ratios of the openings, the deposition may result in a larger deposition rate at an upper portion of the opening than at a lower portion of the opening. Hence, the layer of the dielectric material may pile-up or neck at the upper portion of the opening before a lower portion of the opening is filled with the dielectric material causing the opening to be pinched-off before being completely filled. Respective gaps or voids 76 can therefore be formed within the dielectric material of the gate spacers 74. A gas, such as a gas(es) used during the deposition of the dielectric material of the gate spacers 74 or any other species that can diffuse into the gaps or voids 76, may be in the gaps or voids 76. In a region of the gate spacer 74 between the gate stack and the lower contacts 70, a height H3 of the gaps or voids 76 (e.g., from a bottom surface to a top surface containing the gap or void 76) can be in a range from about 0.3 times the first height H1 to about 0.7 times the first height H1. A planarization process, such as a CMP, may be performed to remove excess dielectric material of the gate spacers 74 from the top surfaces of the first dielectric caps 68 and the second dielectric caps 72.

In FIGS. 11A and 11B, an upper ILD (ILD1) 80 is deposited over the first dielectric caps 68, second dielectric caps 72, and gate spacers 74. ILD1 80 is formed of a dielectric material such as PSG, BSG, BPSG, USG, or the like, and may be deposited by any suitable method, such as CVD and PECVD.

First upper contacts 82 and second upper contacts 84 are then formed to the lower contacts 70 and the gate electrode 66, respectively. Openings for first upper contacts 82 are formed through the ILD1 80 and the second dielectric caps 72 to the lower contacts 70. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD1 80. The remaining liner and conductive material form first upper contacts 82 in the openings and to the lower contacts 70. Then, openings for second upper contacts 84 are formed through the ILD1 80 and the first dielectric caps 68 to the gate electrode 66. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD1 80. The remaining liner and conductive material form second upper contacts 84 in the openings and to the gate electrode 66.

FIGS. 11A and 11B illustrate cross-sections C-C and D-D. Cross-section C-C is depicted by the layout view of FIG. 11C, and cross-section D-D is depicted by the layout view of FIG. 11D. FIGS. 11C and 11D illustrate cross-sections A-A and B-B that are depicted by FIGS. 11A and 11B, respectively. Cross-section C-C is at a lower vertical level than cross-section D-D. Cross-section C-C intersects the gate electrode 66, the gate dielectric layers 64, the gate spacers 74, the gaps or voids 76, and the lower contacts 70. Cross-section D-D intersects the first dielectric caps 68, the second dielectric caps 72, the gate spacers 74, the first upper contacts 82, and the second upper contacts 84.

FIGS. 11C and 11D illustrate that the gate spacers 74 encircle a respective gate stack (e.g., gate dielectric layer 64 and gate electrode 66). Further, FIG. 11C illustrates that the gaps or voids 76 within the gate spacers 74 can also encircle a respective gate stack.

Although not explicitly shown, a person having ordinary skill in the art will readily understand that further processing steps may be performed on the structure in FIGS. 11A and 11B. For example, various Inter-Metal Dielectrics (IMD) and their corresponding metallizations may be formed over ILD1 80.

FIGS. 12A-B and 13A-B are cross-sectional views of intermediate stages in the manufacturing of finFETs in accordance with another exemplary embodiment. The manufacturing process in FIGS. 12A-B and 13A-B shows a modification to the manufacturing process of FIGS. 2A-B and 11A-B. Processing proceeds as discussed above with respect to FIGS. 2A-B through FIGS. 9A-B. In FIGS. 11A and 11B, at least portions of the dummy gate spacers 54 are removed, and gate spacers 74 with respective gaps or voids 76 are formed where the portions of the dummy gate spacers 54 were removed. As with FIGS. 10A and 10B, the dummy gate spacers 54 may be removed using an appropriate etch selective to the material of the dummy gate spacers 54. In FIG. 12B, the entirety of the dummy gate spacers 54 is not removed. As shown, the dummy gate spacers 54 are only removed from along the entire first height H1, e.g., above the plane of the top surfaces of the fins 42. The dummy gate spacers 54 at and below the plane of the top surfaces of the fins 42 remains. As with FIG. 10A and 10B, the removal of the dummy gate spacers 54 results in an opening encircling each gate stack, and between each gate stack and a respective adjacent lower contact 70 and/or remaining portions of the ILD0 60. In this embodiment, the openings have aspect ratios corresponding to the aspect ratio of the width W to the first height H1 of the dummy gate spacers 54 that was previously discussed. Some embodiments contemplate that any amount of the dummy gate spacers 54 can be removed and can remain after the removal.

As in FIGS. 10A and 10B, the gate spacers 74 are then formed in the openings. Due to the high aspect ratios of the openings, the deposition of the dielectric material of the gate spacers 74 may result in a larger deposition rate at an upper portion of the opening than at a lower portion of the opening. Hence, as discussed above, respective gaps or voids 76 can therefore be formed within the dielectric material of the gate spacers 74. A gas, such as a gas(es) used during the deposition of the dielectric material of the gate spacers 74 or any other species that can diffuse into the gaps or voids 76, may be in the gaps or voids 76. A planarization process, such as a CMP, may be performed to remove excess dielectric material of the gate spacers 74 from the top surfaces of the first dielectric caps 68 and the second dielectric caps 72.

In FIGS. 13A and 13B, ILD0 80, first upper contacts 82, and second upper contacts 84 are formed as discussed with respect to FIGS. 11A and 11B. It is worth noting that the layout views of FIGS. 11C and 11D are the same with this depicted modification in FIGS. 12A-B and 13A-B.

FIGS. 14A-B through 21A-B are cross-sectional views of intermediate stages in the manufacturing of finFETs in accordance with another exemplary embodiment. Processing proceeds as discussed above with respect to FIGS. 2A-B through FIGS. 3A-B. Processing continues as discussed above with respect to FIGS. 4A-B, except that, instead of forming dummy gate spacers 54, multi-layer gate spacers 90 are formed. In FIGS. 14A and 14B, multi-layer gate spacers 90 are formed along sidewalls of the dummy gates 48, dummy gate dielectrics 46, and masks 50. The multi-layer gate spacers 90 comprise a first sub-layer 92 on the sidewalls of the dummy gates, 48, dummy gate dielectrics 46, and masks 50; a dummy second sub-layer 94 on the first sub-layer 92; and a third sub-layer 96 on the dummy second sub-layer 94. Each of the sub-layers 92, 94, and 96 may be formed by conformally depositing, such as by CVD or the like, and anisotropically etching the respective sub-layer. The materials of the first sub-layer 92 and the third sub-layer 96 may be any appropriate dielectric materials, which may be the same or different, such as silicon nitride, silicon carbon nitride, silicon oxynitride, or the like. The material of the dummy second sub-layer 94 may be any appropriate material, such as aluminum oxide ($Al_2O_3$) or the like, that can be selectively etched relative to the first sub-layer 92, the third sub-layer 96, and other components, as will be discussed subsequently.

Processing continues in FIGS. 15A-B through 19A-B as discussed above with respect to FIGS. 5A-B through 9A-B, respectively, except with the multi-layer gate spacers 90 replacing the dummy spacer 54. After processing through FIGS. 19A and 19B, the multi-layer gate spacers 90 can have a width W, a first height H1, and a second height H2. The width W can correspond to the combined thicknesses of the first sub-layer 92, the dummy second sub-layer 94, and the third sub-layer 96 that were deposited and subsequently etched to form the multi-layer gate spacers 90. The width W can be in a range from about 4 nm to about 10 nm, such as about 6 nm. The thickness of the first sub-layer 92 can be in a range from about 1 nm to about 3 nm, such as about 2 nm. The thickness of the dummy second sub-layer 94, which is illustrated as width Wb, can be in a range from about 2 nm to about 4 nm, such as about 2 nm. The thickness of the third sub-layer 96 can be in a range from about 1 nm to about 3 nm, such as about 2 nm. The first height H1 is from a top surface of the fins 42 to a top surface of the multi-layer gate spacers 90. The first height H1 can be in a range from about 30 nm to about 80 nm, such as about 50 nm. The second height H2 is from a top surface of the isolation regions 44 to the top surface of the multi-layer gate spacers 90. The second height H2 can be in a range from about 80 nm to about 130 nm, such as about 100 nm. A first aspect ratio of the width W of the multi-layer gate spacers 90 to the first height H1 can be in a range from about 3 to about 20, such as about 8. A second aspect ratio of the width W of the multi-layer gate spacers 90 to the second height H2 can be in a range from about 8 to about 33, such as about 17. A third aspect ratio of the width Wb of the dummy second sub-layer 94 to the first height H1 can be in a range from about 7 to about 20, such as about 25. A fourth aspect ratio of the width Wb of the dummy second sub-layer 94 to the second height H2 can be in a range from about 20 to about 65, such as about 50.

In FIGS. 20A and 20B, the dummy second sub-layers 94 in the multi-layer gate spacers 90 are removed, and second sub-layers 98 and gaps or voids 100 are formed where the dummy second sub-layers 94 were removed. The dummy second sub-layers 94 may be removed using an appropriate etch selective to the material of the dummy second sub-layers 94, which etch may not significantly etch the first dielectric caps 68, the second dielectric caps 72, the first sub-layers 92, and the third sub-layers 96. The etch may be, for example, a wet etch, and may be isotropic. By having the first sub-layers 92 and the third sub-layers 96 remain after the dummy second sub-layers 94 are etched, protection may be provided to the gate stack and the lower contacts 70 during the removal of the dummy second sub-layers 94. The entirety of the dummy second sub-layers 94 may be removed, which is what is depicted in FIGS. 20A and 20B. In other words, the dummy second sub-layers 94 are removed from along the entire second height H2. In other embodiments, the entirety of the dummy second sub-layers 94 is not removed. The dummy second sub-layers 94 may be removed from only along the entire first height H1, e.g., above the plane of the top surfaces of the fins 42 such that the dummy second sub-layers 94 at and below the plane of the top surfaces of the fins 42 remains. Some embodiments contemplate that any amount of the dummy second sub-layers 94 can be removed and can remain after the removal. As with FIGS. 10A and 10B, the removal of the dummy second sub-layers 94 results in an opening encircling each gate stack, and between the first sub-layer 92 and the third sub-layer 96 in each of the multi-layer gate spacers 90. In this embodiment, the openings have aspect ratios corresponding to the aspect ratio of the width Wb of the dummy second sub-layers 94 to the second height H2 of the multi-layer gate spacers 90 that was previously discussed. Other embodiments contemplate other aspect ratios depending on the amount of the dummy second sub-layers 94 that is removed, such as an aspect ratio of the width Wb of the dummy second sub-layers 94 to the first height H1 of the multi-layer gate spacers 90.

The second sub-layers 98 are then formed in the openings. The second sub-layers 98 can be an appropriate dielectric material, which may further be a low-k dielectric layer that has a dielectric constant (k) value less than 3.9, which may further be less than 2.0. In some embodiments, the dielectric material of the second sub-layers 98 is silicon carbon oxynitride (SiCON), silicon oxycarbide (SiOC), or the like. The dielectric material of the second sub-layers 98 can be selectively etched relative to the first dielectric caps 68 and the second dielectric caps 72. The second sub-layers 98 can be formed using an appropriate deposition technique, such as ALD, CVD, or the like. If the aspect ratio of the openings is sufficiently low, the deposition may be substantially conformal and form gaps or voids as discussed with respect to FIGS. 10A and 10B. In the illustrated embodiment, due to the higher aspect ratios of the openings, the deposition may result in deposition occurring substantially only at an upper portion of the opening. Hence, the dielectric material of the second sub-layers 98 may be deposited at the upper portion of the opening without a significant amount being deposited in a lower portion of the opening. Respective gaps or voids 100 can therefore be formed below the dielectric material of the second sub-layers 98 and between the first sub-layer 92 and the third sub-layer 96. A gas, such as a gas(es) used during the deposition of the dielectric material of the second sub-layers 98 or any other species that can diffuse into the gaps or voids 100, may be in the gaps or voids 100. In a region of the multi-layer gate spacer 90 between the gate stack and the lower contacts 70, a height H4 of the gaps or voids 100 can be in a range from about 0.3 times the first height H1 to about 0.7 times the first height H1. A planarization process, such as a CMP, may be performed to remove excess dielectric material of the second sub-layers 98 from the top surfaces of the first dielectric caps 68, the second dielectric caps 72, the first sub-layers 92, and the third sub-layers 96. As a result, the multi-layer gate spacers 90 include the first sub-layers, the second sub-layer 98, and the third sub-layers 96 with gaps or voids 100 therein. Processing then continues in FIGS. 21A-B as discussed above with respect to FIGS. 11A-B.

Some embodiments may achieve advantages. For example, by having a gate spacer formed, at least in part, of a low-k dielectric material, parasitic capacitance between the gate electrode and contacts can be reduced. Further, by having a gap or void formed in the gate spacer, the dielectric constant (k) can be further reduced, thereby reducing parasitic capacitance even further. According to some of the embodiments disclosed above, parasitic capacitance between the gate electrode 66 and the lower contacts 70 can be reduced. These advantages may be advantageous for reduced technology nodes, such as 10 nm and below.

An embodiment is a structure. The structure includes a substrate, a gate stack over the substrate, a contact over the substrate, and a spacer disposed laterally between the gate stack and the contact. The spacer includes a first dielectric sidewall portion and a second dielectric sidewall portion. A void is disposed between the first dielectric sidewall portion and the second dielectric sidewall portion.

Another embodiment is a structure. The structure comprises a substrate, a gate dielectric over the substrate, a gate electrode over the gate dielectric, a gate spacer around the gate electrode, a source/drain region in the substrate and proximate to the gate dielectric and gate electrode, and a lower contact connecting to the source/drain region. The gate spacer is disposed between the lower contact and the gate electrode. The gate spacer comprises a first solid dielectric sidewall portion and a second solid dielectric sidewall portion. A void is between the first solid dielectric sidewall portion and the second solid dielectric sidewall portion. The void is around the gate electrode.

A further embodiment is a method. The method comprising forming a first inter-layer dielectric layer over a substrate; forming a gate stack in the first inter-layer dielectric layer and over the substrate; forming a contact through the first inter-layer dielectric layer to the substrate; and forming a gate spacer between the gate stack and the contact. The gate spacer is around the gate stack and has a void around the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a substrate with a fin;
    a gate stack over the fin;
    a contact over the substrate; and
    a spacer disposed laterally between the gate stack and the contact, the spacer comprising a first dielectric sidewall portion and a second dielectric sidewall portion, a void being disposed between the first dielectric sidewall portion and the second dielectric sidewall portion.

2. The structure of claim 1, wherein the first dielectric sidewall portion and the second dielectric sidewall portion each comprises a low-k dielectric material.

3. The structure of claim 1, wherein the spacer comprises a solid dielectric material fully enclosing the void within the solid dielectric material, the first dielectric sidewall portion and the second dielectric sidewall portion each being a portion of the solid dielectric material.

4. The structure of claim 1, wherein the spacer comprises a first solid dielectric layer and a second solid dielectric layer, each of the first solid dielectric layer and the second solid dielectric layer extending vertically from the substrate, the first solid dielectric layer being the first dielectric sidewall portion, the second solid dielectric layer being the second dielectric sidewall portion, a solid dielectric material being disposed between the first solid dielectric layer and the second solid dielectric layer above the void.

5. The structure of claim 1, wherein the void contacts a surface of the substrate.

6. The structure of claim 1, wherein the spacer laterally encircles the gate stack, and the void laterally encircles the gate stack.

7. The structure of claim 1, wherein the spacer has a first height from a surface of the substrate and in a direction normal to the surface of the substrate, the void having a second height from a bottom surface of the void to a top surface of the void, a ratio of the second height to the first height being in a range from 0.3 to 0.7.

8. The structure of claim 1 further comprising:
    a source/drain region in the substrate and proximate to the gate stack, the contact connecting to the source/drain region;
    a first inter-layer dielectric layer over the substrate and laterally around the gate stack, the contact being disposed through the first inter-layer dielectric layer; and
    a second inter-layer dielectric layer over the first inter-layer dielectric layer, the contact, the gate stack, and the spacer.

9. The structure of claim 8 further comprising:
    a first dielectric cap over the contact and the first inter-layer dielectric layer; and
    a second dielectric cap over the gate stack, respective top surfaces of the first dielectric cap, the second dielectric cap, and the spacer being co-planar.

10. A structure comprising:
    a substrate;
    a gate dielectric over the substrate;
    a gate electrode over the gate dielectric;
    a gate spacer around the gate electrode, the gate spacer comprising a first solid dielectric sidewall portion and a second solid dielectric sidewall portion, a void being between the first solid dielectric sidewall portion and the second solid dielectric sidewall portion, the void being around the gate electrode;
    a source/drain region in the substrate and proximate to the gate dielectric and gate electrode; and
    a lower contact connecting to the source/drain region, the gate spacer being disposed immediately adjacent to the lower contact and between the lower contact and the gate electrode.

11. The structure of claim 10, wherein the spacer comprises a continuous layer enclosing the void, each of the first solid dielectric sidewall portion and the second solid dielectric sidewall portion being a portion of the continuous layer.

12. The structure of claim 10, wherein the first solid dielectric sidewall portion is a first layer, and the second solid dielectric sidewall portion is a second layer separated from the first layer, the void being disposed between the first layer and the second layer, the void contacting a surface of the substrate, a solid dielectric material being disposed between the first layer and the second layer and above the void.

13. The structure of claim 10 further comprising:
a first inter-layer dielectric layer over the substrate, the gate electrode being in the first inter-layer dielectric layer, the lower contact being through the first inter-layer dielectric layer;
a first dielectric cap over the gate electrode;
a second dielectric cap over the lower contact, top surfaces of the first dielectric cap, the second dielectric cap, and the gate spacer being co-planar;
a second inter-layer dielectric layer over the first dielectric cap, the second dielectric cap, and the gate spacer;
a first upper contact extending through the second inter-layer dielectric layer and the first dielectric cap and connecting to the gate electrode; and
a second upper contact extending through the second inter-layer dielectric layer and the second dielectric cap and connecting to the lower contact.

14. A structure comprising:
a gate dielectric over a substrate;
a gate electrode over the gate dielectric;
a contact in physical connection with the substrate at a point laterally removed from the gate electrode;
a dielectric material surrounding the gate electrode and at least partially located between the gate electrode and the contact, the dielectric material comprising a first material throughout the dielectric material, wherein the dielectric material comprises a first sidewall facing the contact, the first sidewall being straight as the first sidewall extends from a first side of the dielectric material facing the substrate to a second side of the dielectric material opposite the first side; and
a void surrounded by the dielectric material, wherein the void encircles the gate electrode.

15. The structure of claim 14, wherein the dielectric material has a first height and the void has a second height that is between about 0.3 and 0.7 times the first height.

16. The structure of claim 14, wherein the void exposes a portion of the substrate.

17. The structure of claim 14, further comprising an inter-layer dielectric surrounding the contact.

18. The structure of claim 14, further comprising a dielectric cap located over the gate electrode.

19. The structure of claim 18, wherein the dielectric cap has a top surface that is planar with a top surface of the dielectric material.

20. The structure of claim 14, wherein a portion of the dielectric material is interposed between the void and the substrate.

* * * * *